United States Patent
Nakamura

(10) Patent No.: US 6,740,966 B2
(45) Date of Patent: May 25, 2004

(54) SEMI-CONDUCTOR APPARATUS, A METHOD OF FABRICATION OF THE SAME, AND A REINFORCING TAPE USED IN FABRICATION OF THE SAME

(75) Inventor: Nakae Nakamura, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 207 days.

(21) Appl. No.: 09/799,550

(22) Filed: Mar. 7, 2001

(65) Prior Publication Data

US 2001/0008303 A1 Jul. 19, 2001

Related U.S. Application Data

(62) Division of application No. 09/451,116, filed on Nov. 30, 1999, now Pat. No. 6,313,526.

(30) Foreign Application Priority Data

Dec. 1, 1998 (JP) .......................... 10-342105

(51) Int. Cl.$^7$ .............. H01L 23/053; H01L 23/495; H01L 23/02; H01L 21/44; H01L 21/48
(52) U.S. Cl. .............. 257/701; 257/678; 257/668; 438/125
(58) Field of Search .............. 438/125; 257/668, 257/678, 704; 242/388, 388.2, 370, 398, 389, 397

(56) References Cited

U.S. PATENT DOCUMENTS

| | | | | |
|---|---|---|---|---|
| 4,286,860 A | * | 9/1981 | Gursky et al. | 396/624 |
| 4,944,850 A | * | 7/1990 | Dion | 205/125 |
| 4,956,605 A | | 9/1990 | Bickford et al. | |
| 5,023,202 A | * | 6/1991 | Long et al. | 29/827 |
| 5,136,827 A | | 8/1992 | Sawaya | |
| 5,252,141 A | * | 10/1993 | Inoue et al. | 136/251 |
| 5,384,204 A | | 1/1995 | Yumoto et al. | |
| 5,389,191 A | * | 2/1995 | Muramatsu et al. | 156/510 |
| 5,578,919 A | * | 11/1996 | Semba et al. | 324/158.1 |
| 5,805,117 A | * | 9/1998 | Mazurek et al. | 345/1.3 |
| 5,837,154 A | * | 11/1998 | Okabe et al. | 216/14 |
| 5,960,961 A | * | 10/1999 | Gutentag | 206/714 |
| 5,975,178 A | * | 11/1999 | Otsuka et al. | 156/358 |
| 6,008,542 A | * | 12/1999 | Takamori | 257/773 |

(List continued on next page.)

FOREIGN PATENT DOCUMENTS

| | | |
|---|---|---|
| EP | 495 282 | 7/1992 |
| JP | 62-274737 | 11/1987 |
| JP | 62-291125 | 12/1987 |
| JP | 02-091956 | 3/1990 |
| JP | 4-48629 | 4/1992 |
| JP | 4-80048 | 7/1992 |
| JP | 09-172041 | 6/1997 |
| JP | 2000-077484 | 3/2000 |
| KR | 1992-0015520 | 8/1992 |
| KR | 1998-044545 | 9/1998 |

OTHER PUBLICATIONS

U.S. Patent Application No. 09/451,116, filed Nov. 30, 1999
Translation of Taiwan Office Action (Jan. 2001).
Document Bibliography and Abstract, EP0495282, Jul. 07 1992, TAKAAKI et al.
Japanese Office Action dated Oct. 7, 2003 (along with English Translation thereof).

Primary Examiner—Matthew Smith
Assistant Examiner—Chuong A Luu
(74) Attorney, Agent, or Firm—Nixon & Vanderhye P.C.

(57) ABSTRACT

A semiconductor apparatus includes a thin film belt-like insulating tape having a plurality of predetermined wire patterns thereon, and a plurality of IC chips that are provided on a surface of the insulating tape at uniform spaces in a lengthwise direction and electrically connected with the wire patterns, and further includes thick film reinforcing tapes with sprocket holes for transport use provided at uniform spaces, the reinforcing tapes being provided on both side portions of the insulating tape, in the lengthwise direction.

9 Claims, 19 Drawing Sheets

U.S. PATENT DOCUMENTS

| | | | | |
|---|---|---|---|---|
| 6,011,694 A | * | 1/2000 | Hirakawa | ................... 361/774 |
| 6,049,121 A | | 4/2000 | Toyosawa et al. | |
| 6,054,975 A | | 4/2000 | Kurokawa et al. | |
| 6,057,174 A | | 5/2000 | Hashimoto | |
| 6,307,269 B1 | * | 10/2001 | Akiyama et al. | ........... 257/778 |
| 6,465,876 B1 | * | 10/2002 | Kitano et al. | ............... 257/668 |

* cited by examiner

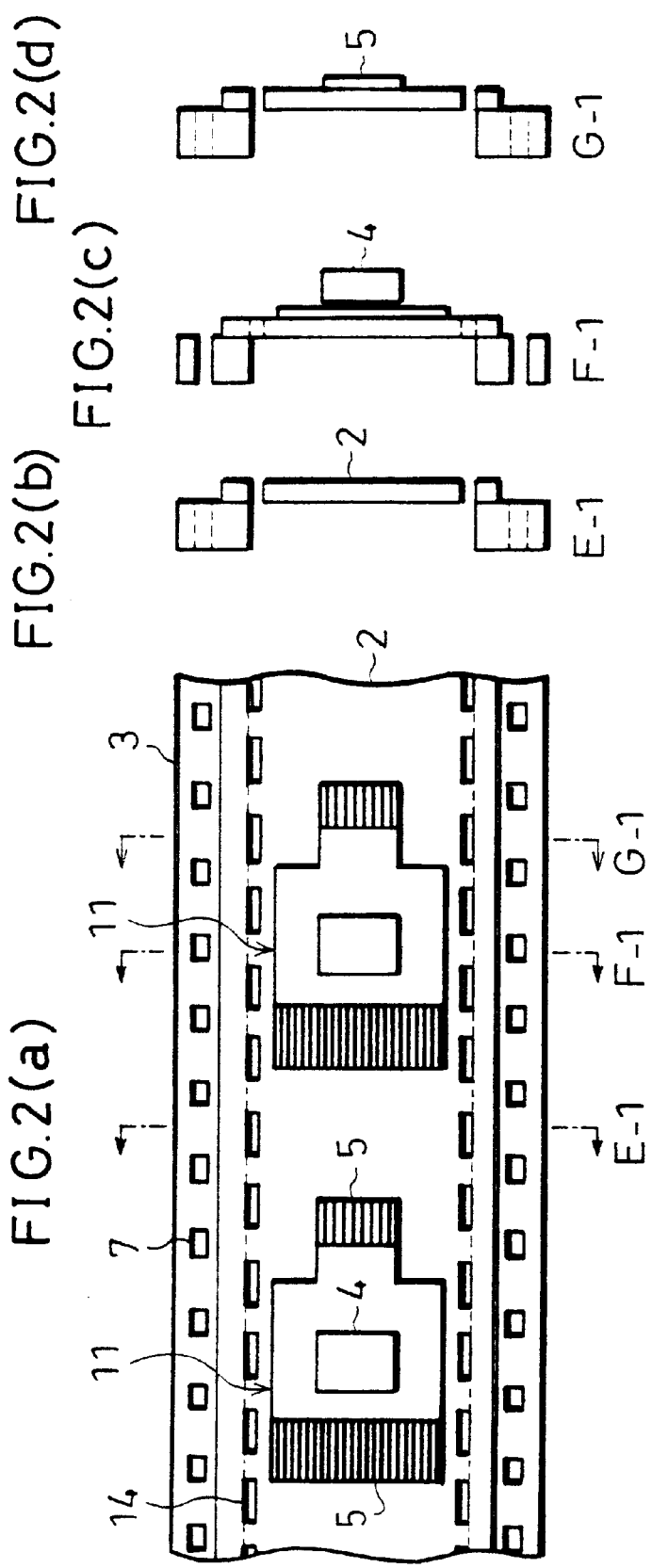

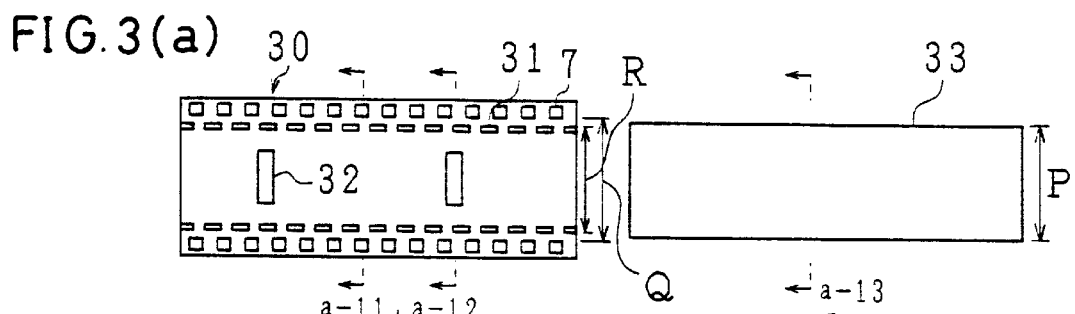
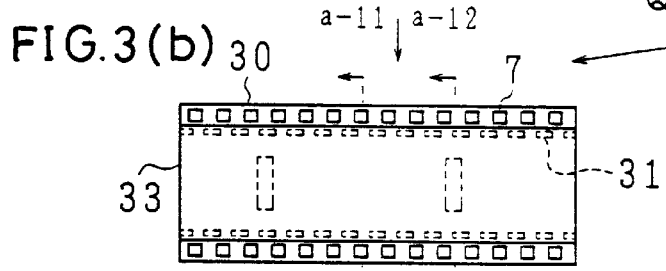
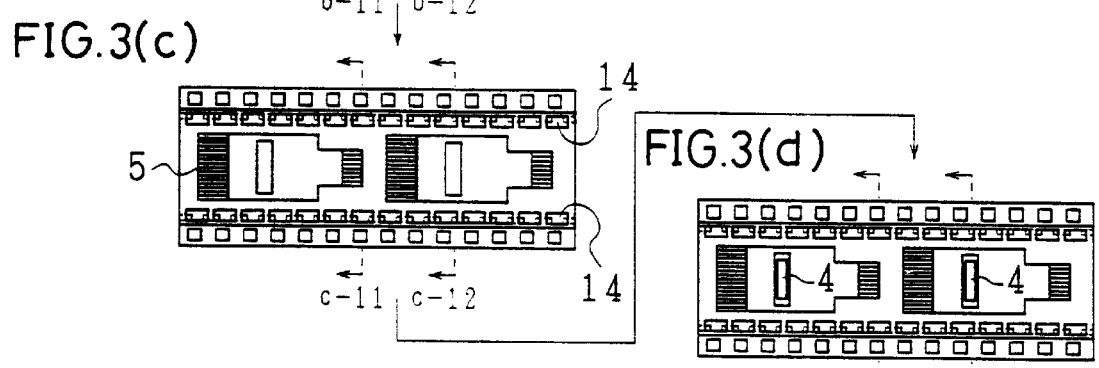
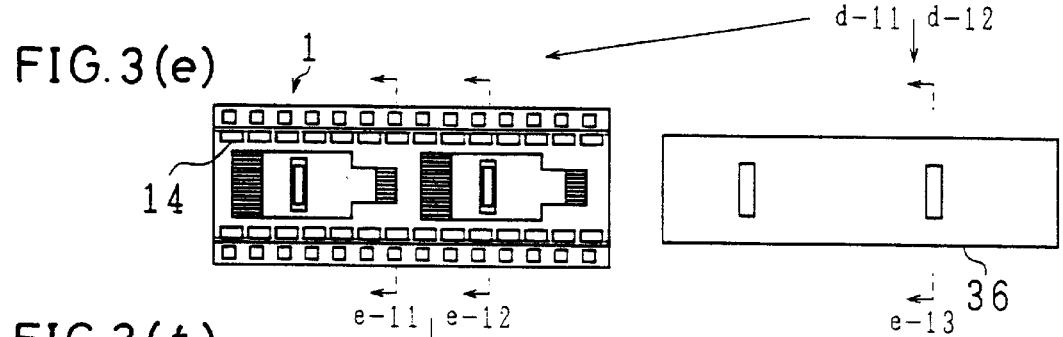

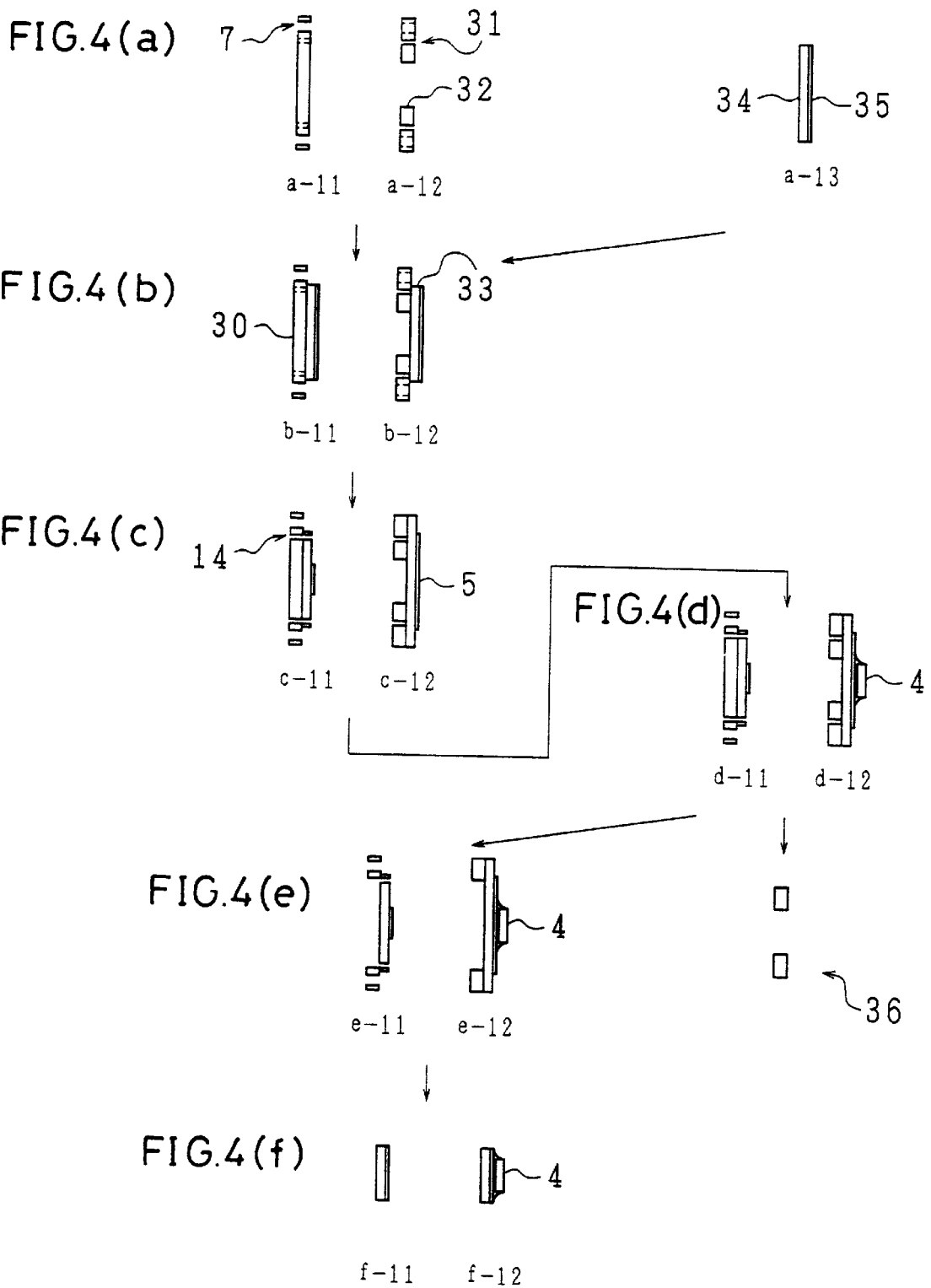

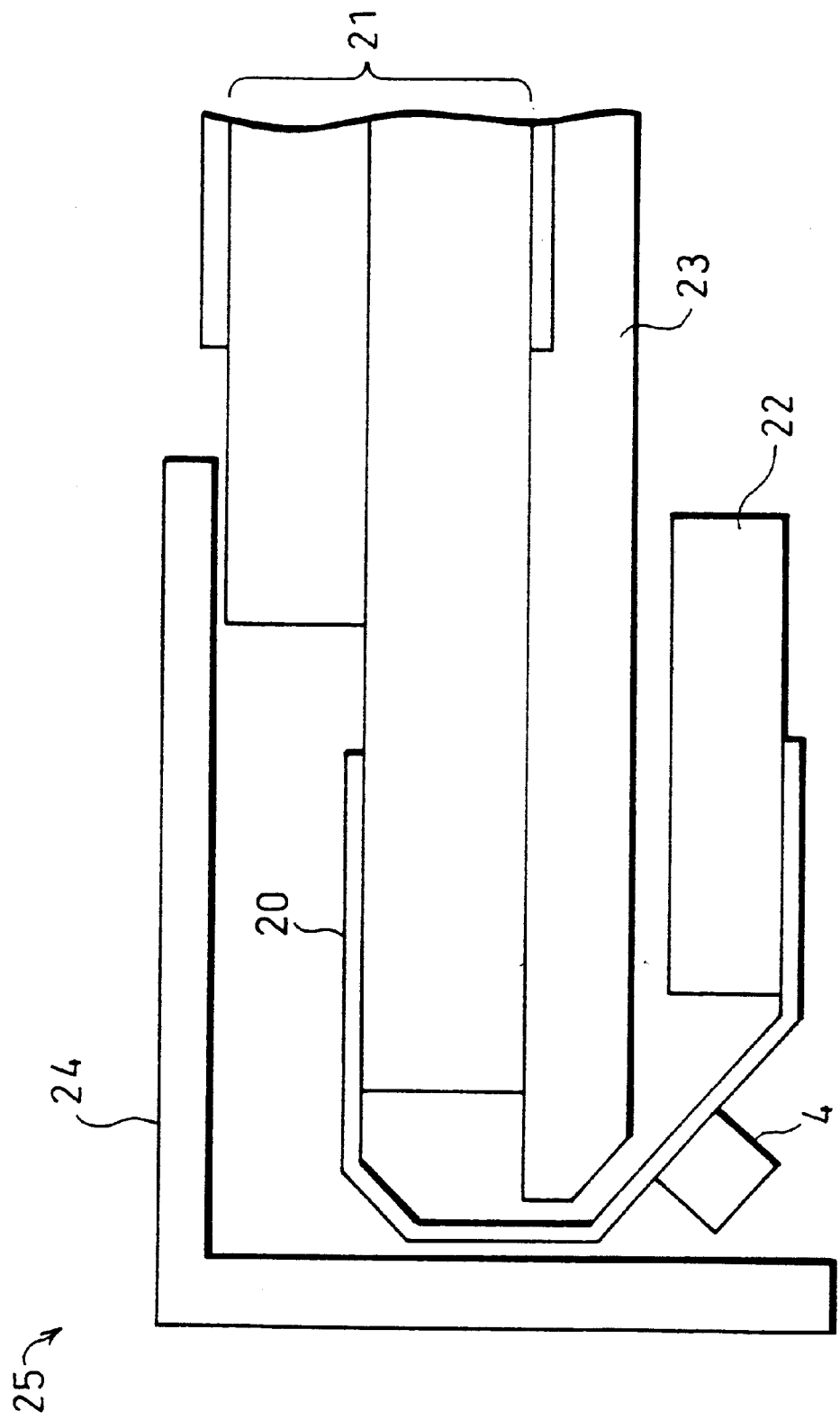

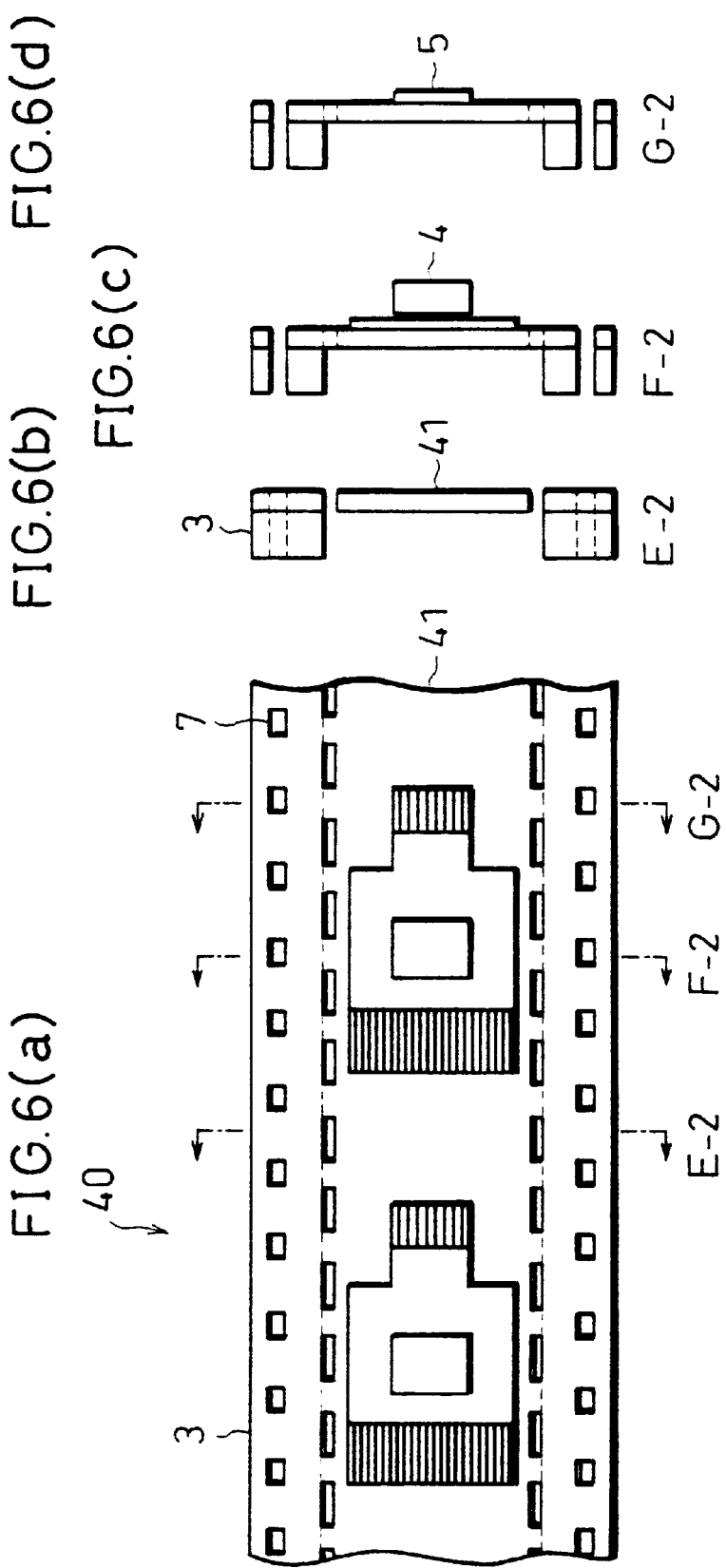

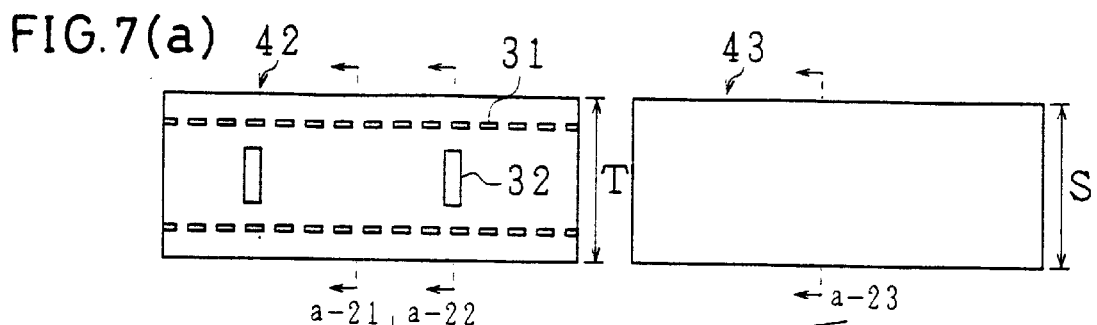
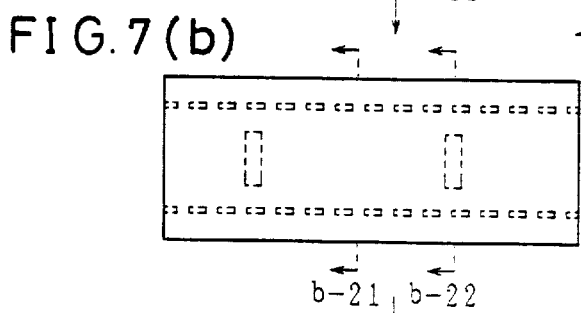
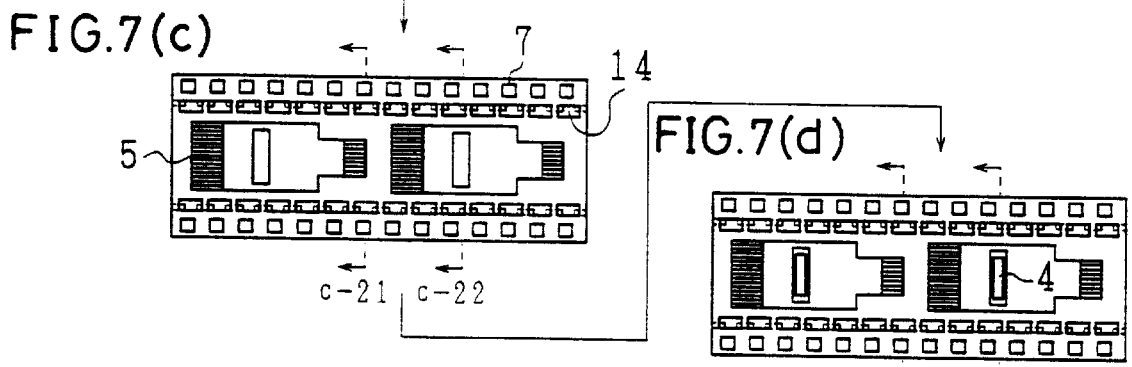
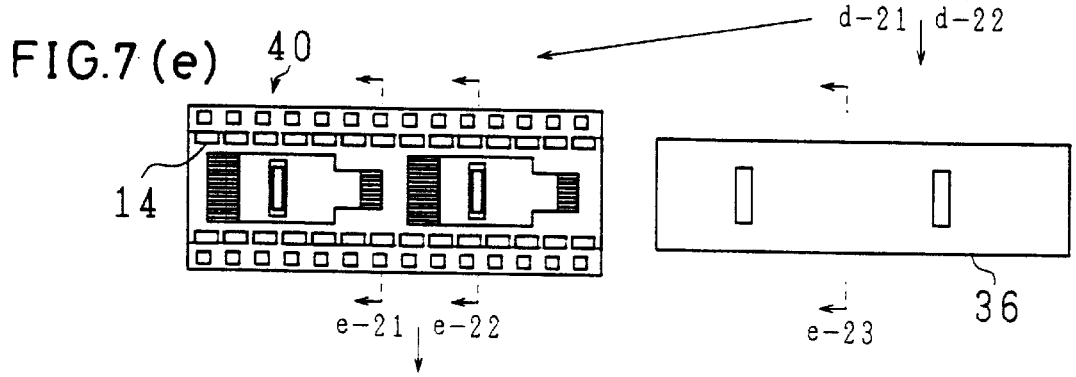
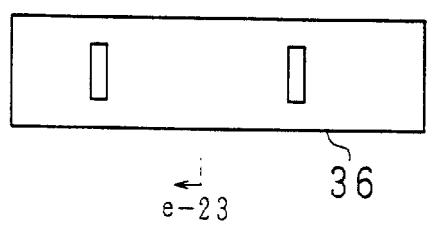

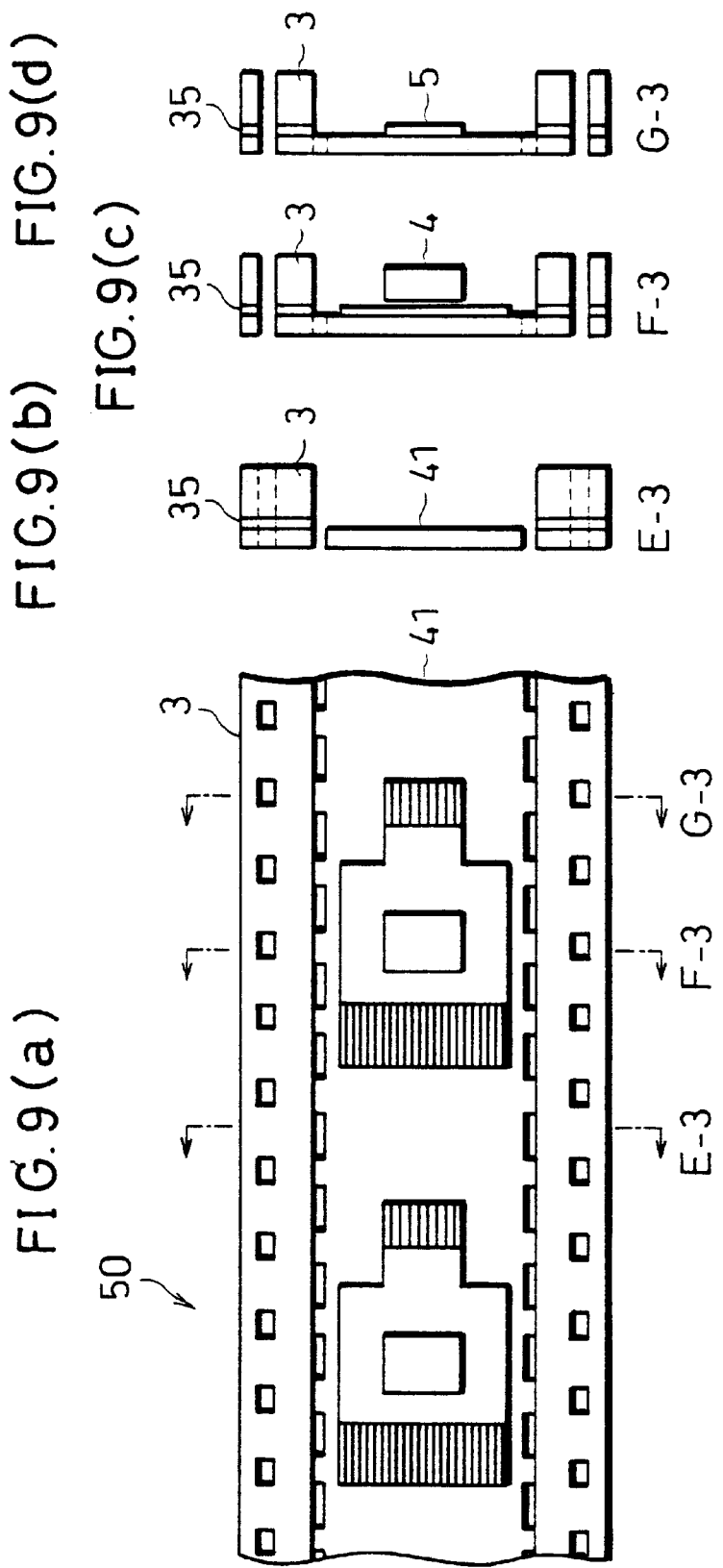

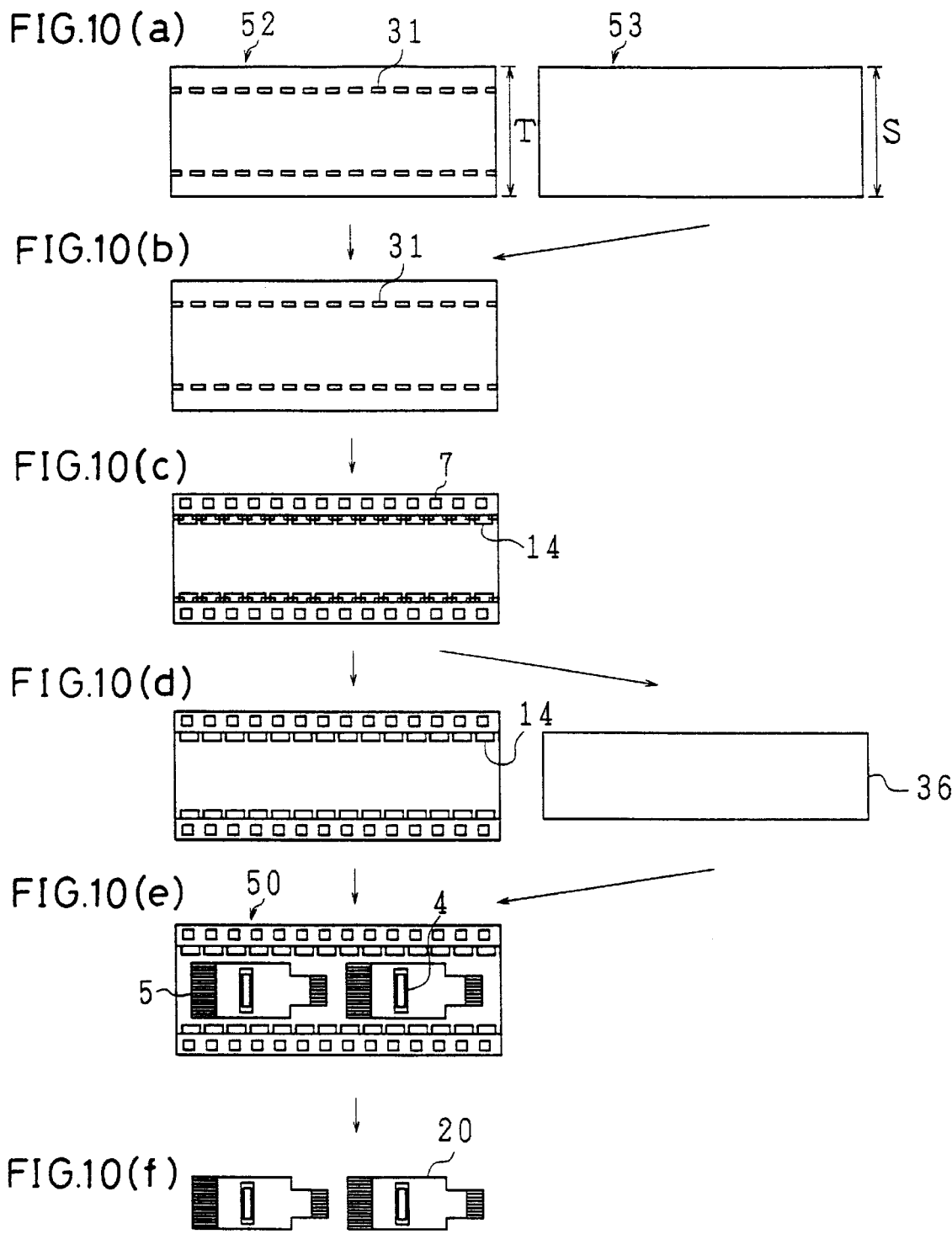

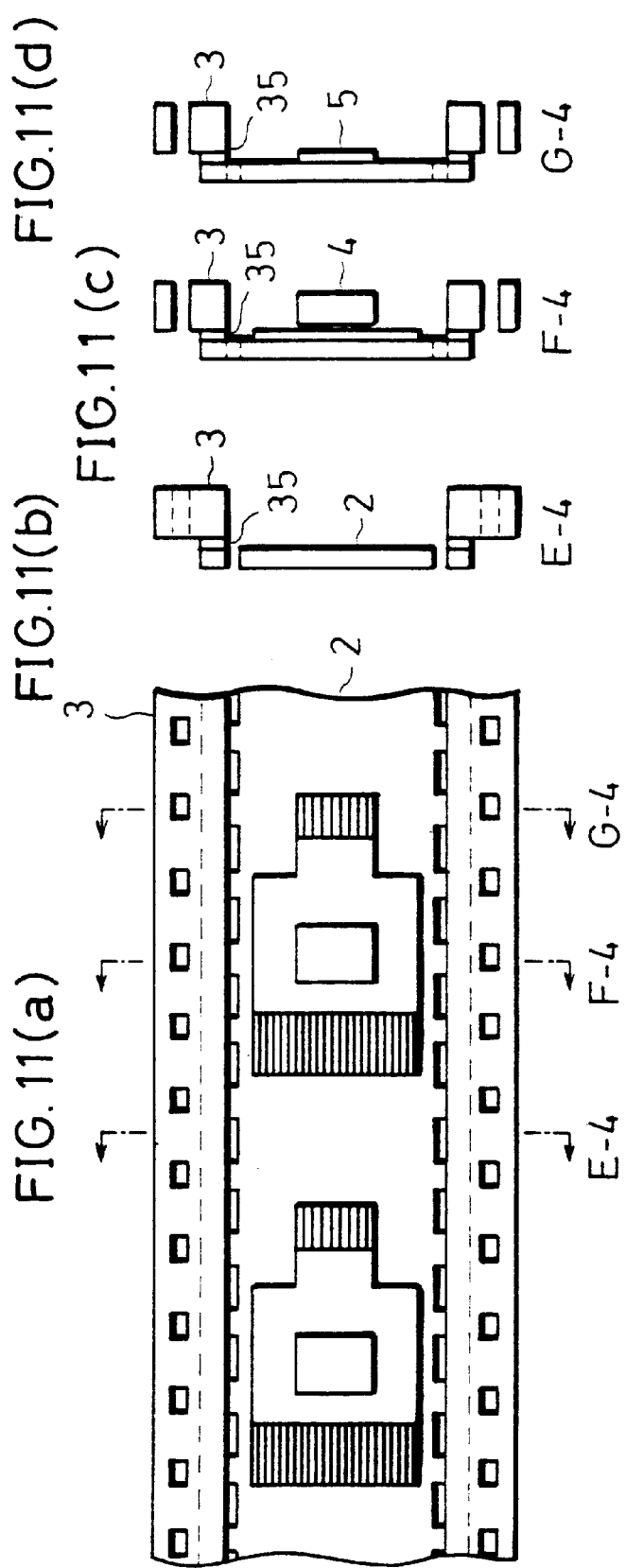

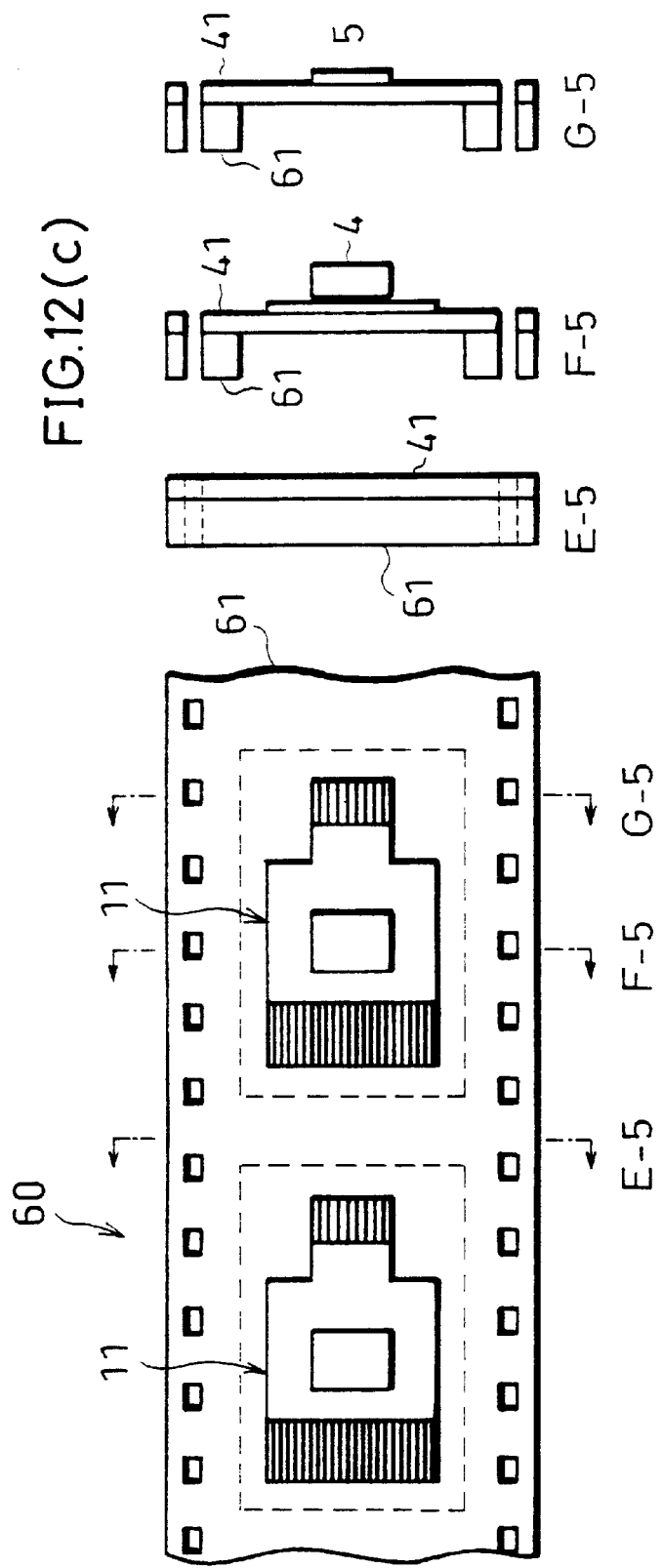

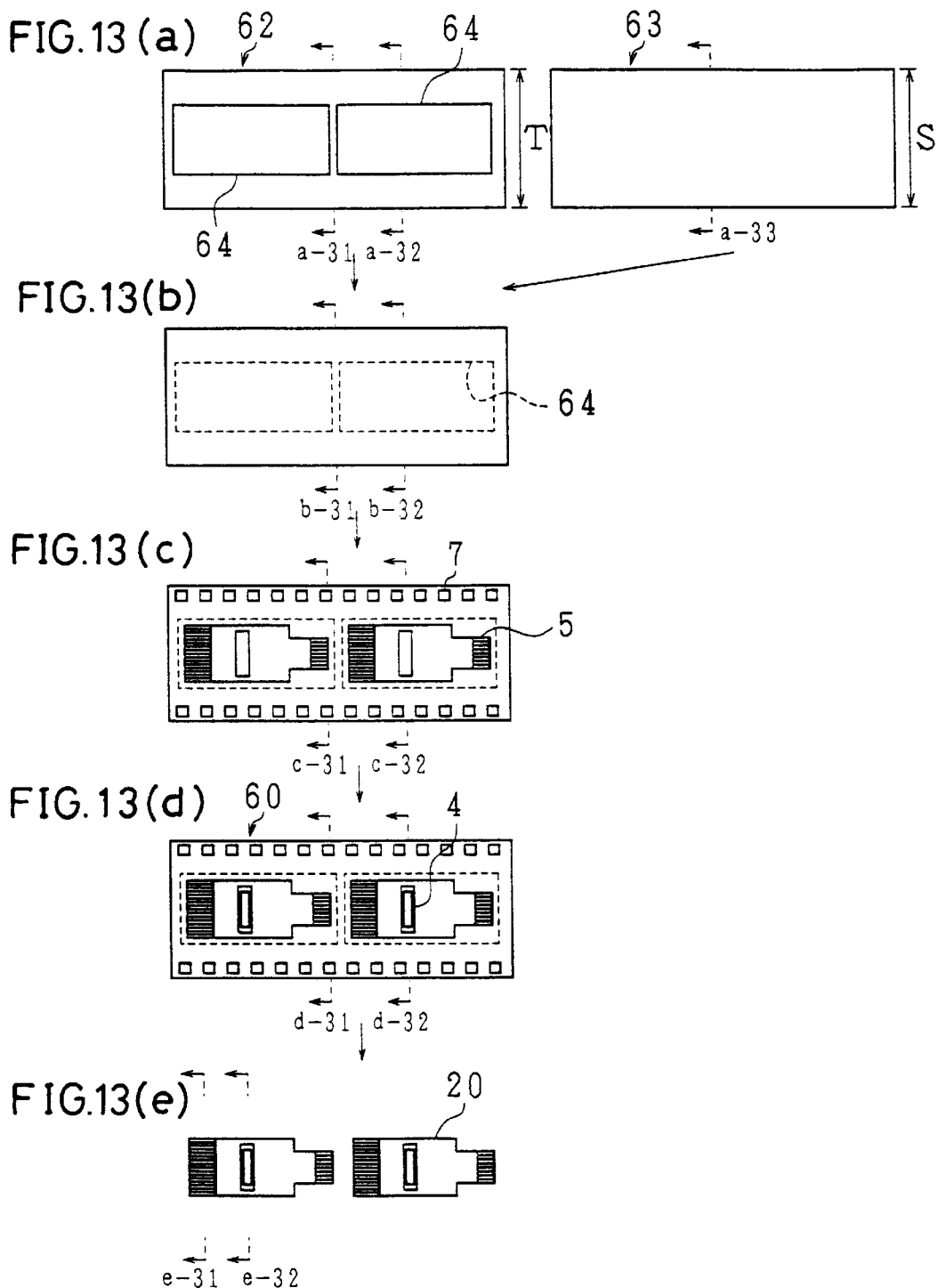

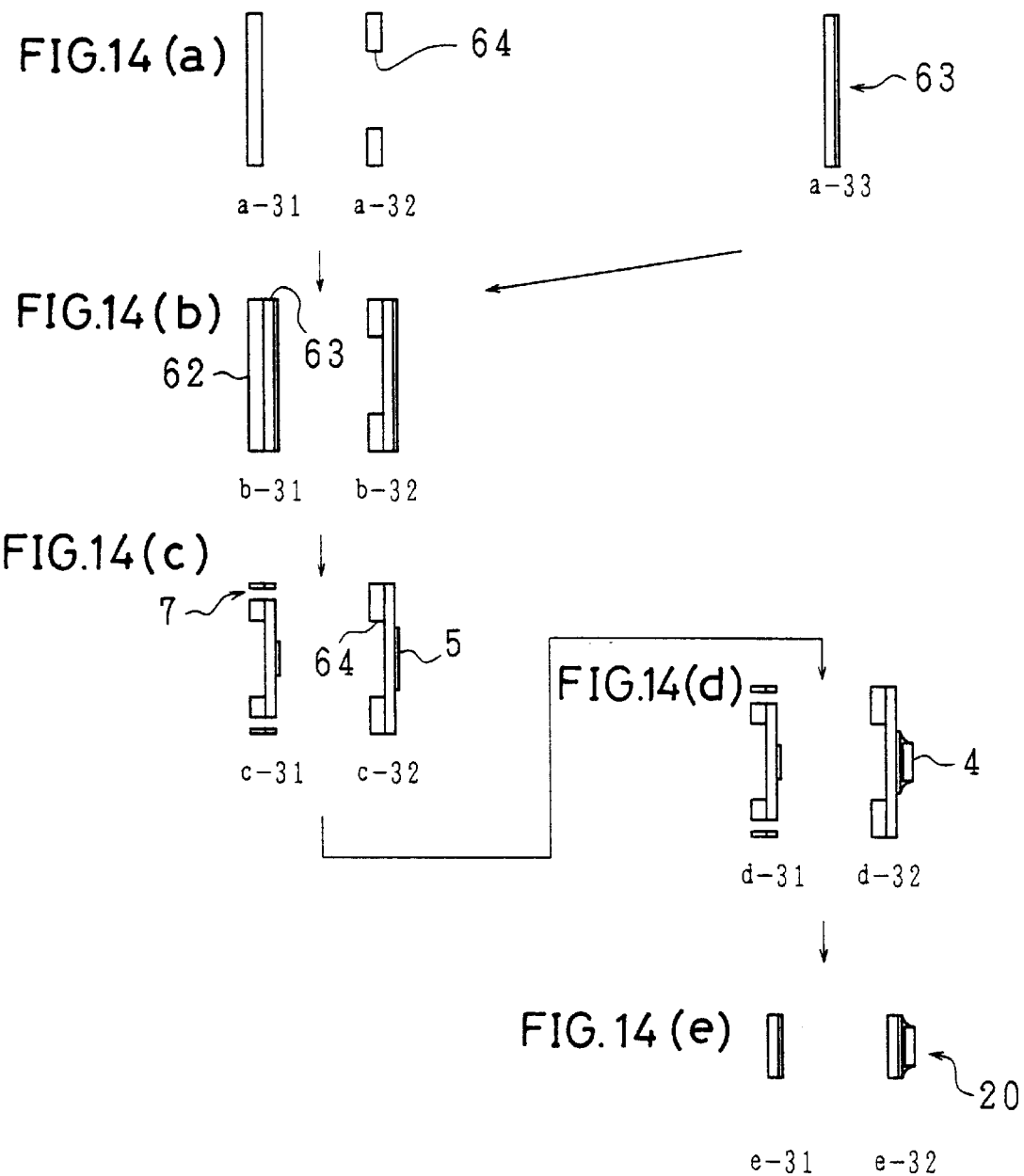

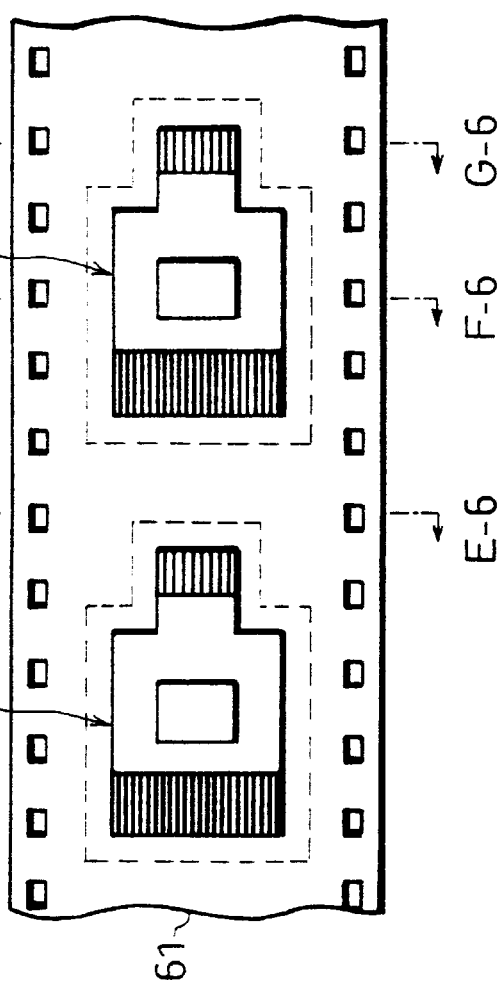

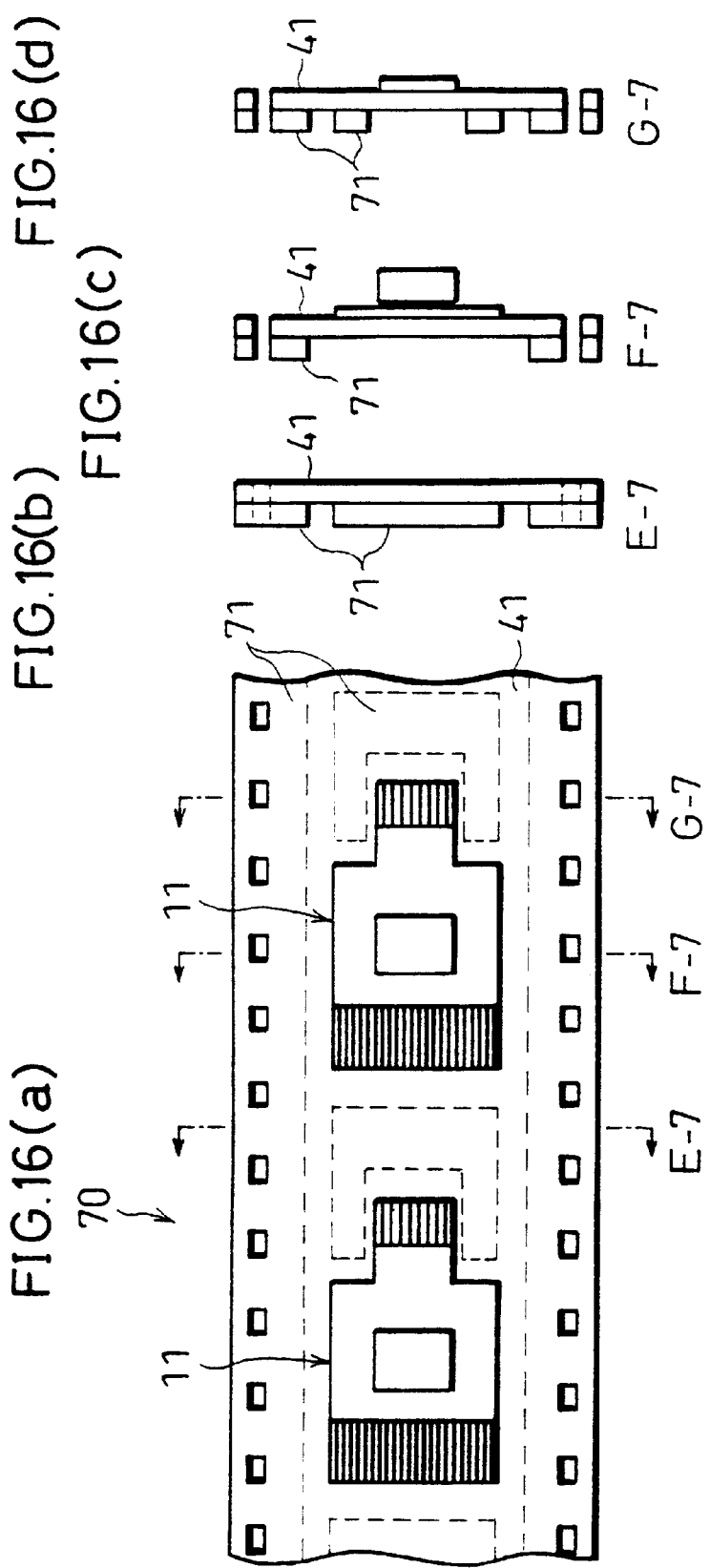

SEMI-CONDUCTOR APPARATUS, A METHOD OF FABRICATION OF THE SAME, AND A REINFORCING TAPE USED IN FABRICATION OF THE SAME

This is a divisional of application Ser. No. 09/451,116, filed Nov. 30, 1999, now U.S. Pat. No. 6,313,526, the entire content of which is hereby incorporated by reference in this application.

FIELD OF THE INVENTION

The present invention relates to a semiconductor apparatus, a method of fabrication of the same, and a reinforcing tape used in fabrication of the same. The semiconductor apparatus is, for example, a tape carrier in a belt form on which a plurality of semiconductor devices flexible and bendable are provided in a lengthwise direction.

BACKGROUND OF THE INVENTION

Recently, a semiconductor package applied to a middle-size or small-size liquid crystal product or the like is increasingly required to be further smaller, lighter, and thinner. A driver semiconductor package applied to a small liquid crystal panel in a frame size, particularly, is required to have flexibility. Semiconductor packages classified into a TCP (tape carrier package) type and a COF (chip on film) type have conventionally been applicable for the foregoing object.

A TCP-use tape carrier 100 is a tape carrier in a long belt form as shown in FIGS. 18(a) and 18(b), which is composed of an insulating tape 111 having sprocket holes 101 on both sides so that handling of the same, for example, transport and position adjustment, in the process of fabrication is facilitated. The tape carrier 100 is designed so that a plurality of devices 102 are disposed at uniform spaces in a lengthwise direction (in FIGS. 18(a) and 18(b), however, only one device 102 is shown). Each device 102 is to be cut out therefrom along a cutout line 103 so as to be used as an independent semiconductor device. Besides, each device 102 is equipped with an IC chip 104 and a wire pattern 105, and further, has an installation-use opening 106 which is usually called "device hole" is provided for installation of the IC chip 104.

Wires (inner leads) 107 of the wire patterns 105, which are drawn to the opening 106, are electrically connected with corresponding electrode terminals 108 of the IC chips 104, respectively, as shown in FIG. 18(b). Connections of wires 107 of the wire patterns 105 with the IC chips 104 are sealed with resin 109. Exposed parts of the wire patterns 105, except connector sections at ends which are, upon use, to be connected with other substrates or the like, are coated with solder resist 110 so that a state of insulation is secured.

On the other hand, a COF-use tape carrier 120 is a tape carrier formed relatively short, in a rectangular or square shape as shown in FIGS. 19(a) and 19(b). Since a thin film 121 is used therein as a substrate, a reinforcing film 122 is made to adhere with use of an adhesive 126 to an entirety of a lower surface of the thin film 121. A plurality of devices 123 are disposed on the thin film 121 at uniform spaces, and each device 123 is cut out therefrom along an cutout line 127 so as to be used as an independent semiconductor device.

Each device 123 is equipped with an IC chip 124 and a wire pattern 125, but unlike the TCP-use tape carrier 100, the device 123 does not have an installation-use opening for installation of the IC chip 124. In other words, the IC chip 124 is provided on a surface of the thin film 121, as shown in FIG. 19(b).

Wires 128 of the wire patterns 125 are electrically connected with corresponding electrode terminals 129 of the IC chips 124, respectively. Connections of the wires 128 with the IC chips 124 are sealed with resin 130. Exposed parts of the wire patterns 125, except connector sections at ends which are, upon use, to be connected with other substrates or the like, are coated with solder resist 131 so that a state of insulation is secured.

As to the above-described conventional tape carriers, following problems arise in the process of fabrication.

In the case of the TCP-use tape carrier 100, if formed thinner, it becomes very soft thereby becoming fragile against pulling stress, and the sprocket holes 101 for transport use tend to be broken, thereby making the fabrication difficult. Further, in the case where each device 102 is used in a bent state, the conventional tape carrier 100 is hard per se, therefore additionally needs a bending-use hole 113 at a portion at which it is bent (see FIG. 18(a)). This causes the costs for fabrication to rise the more.

Further, the design with the device hole 106 makes the inner leads 107 free, thereby making the device prone to defects of connection between the IC chip 104 and the wire pattern 105. As a result, finer pitched wire pattern 105 becomes difficult.

Further, to fabricate the tape carrier 100, the adhesive 112 is preliminarily applied onto the insulating tape 111, and after holes are formed, a copper foil is laminated on the adhesive 112 and then subjected to etching to a predetermined pattern so as to have the wire pattern 105. Thus, the fabrication is performed in a state in which the adhesive 112 is applied to the insulating tape 111, thereby making the work awkward.

On the other hand, in the case of the COF-use tape carrier 120, which uses the thin film 121 but does not have sprocket holes, transport and position adjustment in the process of fabrication are not facilitated as compared with the case of the TCP-use tape carrier 100. Further, after each device 123 is cut out along the cutout line 127, a step of peeling off the reinforcing film 122 from the thin film 121 is needed, and the process of fabrication is complicated the more for the foregoing step.

SUMMARY OF THE INVENTION

The object of the present invention is to provide (i) a semiconductor apparatus that enables to provide a semiconductor device bendable when used and that is treated with ease during process of fabrication of the same, (ii) a process of fabrication of the foregoing semiconductor apparatus, and (iii) a reinforcing tape used in the process of fabrication of the semiconductor apparatus.

To achieve the foregoing object, a semiconductor apparatus of the present invention, which includes a thin film belt-like insulating tape having a plurality of predetermined wire patterns thereon, and a plurality of semiconductor elements provided on a surface of the insulating tape at uniform spaces in a lengthwise direction and electrically connected with the wire patterns, comprises a thick film reinforcing member with holes for transport use provided at uniform spaces, the reinforcing members being provided on both side portions of the insulating tape, in the lengthwise direction.

With foregoing configuration wherein the insulating tape is formed thin, it is possible to provide a semiconductor device which can be bent when used. Further, since the thick reinforcing member having transport-use holes at uniform spaces is provided, transport, position adjustment, and other works in the process of fabrication are executed in a good state.

The semiconductor element is installed on the insulating tape and no opening for semiconductor element installation use is formed in the insulating tape. Therefore, the semiconductor elements and the wire patterns can be connected with each other in a good state, thereby allowing the wire patterns to be finer pitched, as compared with a case where installation-use openings are formed.

Besides, in the case where a tape with a width equal to that of a standardized TCP-use tape is used as a material for forming the reinforcing member, the conventional facilities used for fabrication of the conventional TCPs can be used for fabrication of the semiconductor apparatuses of the present invention.

To achieve the aforementioned object, a method of fabrication of a semiconductor apparatus of the present invention comprises the steps of (1) forming first holes for transport use, on both sides of a reinforcing tape formed with a thick film, at uniform spaces in a lengthwise direction of the reinforcing tape, and forming second holes for separation use so as to make lines in the lengthwise direction, on both sides of the reinforcing tape and on inner sides to the first holes, (2) making an insulating tape, formed with a thin film narrower than a distance from the first holes on one side to those on the other side, adhere onto an inside part of the reinforcing tape so as to cover the second holes on both the sides, (3) providing a plurality of predetermined wire patterns on the insulating tape in a lengthwise direction of the same, (4) installing a plurality of semiconductor elements on a surface of the insulating tape in the lengthwise direction at uniform spaces, in a manner such that the semiconductor elements are electrically connected with the corresponding wire patterns, respectively, and further, (a) forming third holes, each at a position between two neighboring second holes in each line, in a manner such that each third hole bridges the two neighboring second holes so that the second holes in each line become continued, the step (a) being performed either before the step (3), between the steps (3) and (4), or after the step (4).

According to the foregoing method, the thick film reinforcing tape is made to adhere to the thin film insulating tape, so that the insulating tape is reinforced. Besides, transport and position adjustment of the insulating tape can be executed with use of the first holes of the reinforcing tape. Therefore, in transport and other works with respect to the thin film insulating tape in the process of fabrication of a semiconductor device that can be bent when used, the works of transport and the like are executed in a good state.

Further, after formation of the second holes in lines on both sides of the reinforcing tape, the third holes are formed so that the second holes become continued. This enables subsequent separation of the inside part of the reinforcing tape between the two lines of the second holes from the insulating tape.

Furthermore, by using as the reinforcing tape a tape with a width equal to that of a standardized TCP-use tape, the conventional facilities used for fabrication of the conventional TCPs can be used for fabrication of the semiconductor apparatuses of the present invention.

To achieve the aforementioned object, another method of fabrication of a semiconductor apparatus of the present invention comprises the steps of (1) forming second holes for separation use on both sides of a reinforcing tape formed with a thick film, on inner sides to first holes to be formed later, so as to make lines in a lengthwise direction of the reinforcing tape, (2) making an insulating tape, formed with a thin film with a width substantially equal to that of the reinforcing tape, adhere onto the reinforcing tape so as to be laminated thereon, (3) boring both the reinforcing tape and the insulating tape laminated on each other, so as to form the first holes for transport use, on both sides of the tapes, at uniform spaces in the lengthwise direction, (4) providing a plurality of predetermined wire patterns on the insulating tape in a lengthwise direction of the same, (5) installing a plurality of semiconductor elements on a surface of the insulating tape in the lengthwise direction at uniform spaces, in a manner such that the semiconductor elements are electrically connected with the corresponding wire patterns, respectively, and further, (a) forming third holes, each at a position between two neighboring second holes in each line, in a manner such that each third hole bridges the two neighboring second holes so that the second holes in each line become continued, the step (a) being performed either before the step (4), between the steps (4) and (5), or after the step (5) According to the foregoing method, the thick film reinforcing tape is made to adhere to the thin film insulating tape, so that the insulating tape is reinforced. Besides, transport and position adjustment of the insulating tape can be executed with use of the first holes formed in not only the reinforcing tape but also the insulating tape. Therefore, in the case where the thin film insulating tape is transported and the like in the process of fabrication of a semiconductor device that can be bent when used, the work of transport and the like is executed in a good state.

Furthermore, wide areas can be used for adhesion of the insulating tape to the reinforcing tape, thereby further improving the workability in the process of fabrication.

Furthermore, after formation of the second holes in lines on both sides of the reinforcing tape, the third holes are formed so that the second holes become continued. This enables subsequent separation of the inside part of the reinforcing tape between the two lines of the second holes from the insulating tape.

Furthermore, by using as the reinforcing tape a tape with a width equal to that of a standardized TCP-use tape, the conventional facilities used for fabrication of the conventional TCPs can be used for fabrication of the semiconductor apparatuses of the present invention.

To achieve the aforementioned object, still another method of fabrication of a semiconductor apparatus of the present invention comprises the steps of (1) forming fourth holes in a plurality of areas in which wire patterns and semiconductor elements are to be formed later, the areas being provided in a reinforcing tape formed with a thick film, at uniform spaces in a lengthwise direction of the reinforcing tape, (2) making an insulating tape, formed with a thin film with a width substantially equal to that of the reinforcing tape, adhere onto the reinforcing tape so as to be laminated thereon, (3) boring both the reinforcing tape and the insulating tape laminated on each other, so as to form first holes for transport use, on both sides of the tapes, at uniform spaces in lines in the lengthwise direction, (4) providing a plurality of predetermined wire patterns on the insulating tape in a lengthwise direction of the same, at positions corresponding to the fourth holes, and (5) installing a plurality of semiconductor elements on a surface of the insulating tape in the lengthwise direction at uniform spaces, at positions corresponding to the fourth holes, in a manner such that the semiconductor elements are electrically connected with the corresponding wire patterns, respectively.

According to the foregoing method, the thick film reinforcing tape is made to adhere to the thin film insulating tape, so that the insulating tape is reinforced. Besides, transport and position adjustment of the insulating tape can be executed with use of the first holes formed in not only the reinforcing tape but also the insulating tape. Therefore, in the case where the thin film insulating tape is transported and the like in the process of fabrication of a semiconductor device that can be bent when used, the work of transport and the like is executed in a good state.

Furthermore, wide areas can be used for adhesion of the insulating tape to the reinforcing tape, thereby further improving the workability in the process of fabrication.

Furthermore, since fourth holes are formed, after each semiconductor element and each wire pattern connected therewith are cut out as a semiconductor device, a step of removing the reinforcing tape from each semiconductor device is unnecessary. Therefore, the process of fabrication can be simplified. Moreover, separation of the reinforcing member from the insulating tape is unnecessary in the process of fabrication, resulting in that the process of fabrication is further simplified.

Furthermore, by using as the reinforcing tape a tape with a width equal to that of a standardized TCP-use tape, the conventional facilities used for fabrication of the conventional TCPs can be used for fabrication of the semiconductor apparatuses of the present invention.

To achieve the aforementioned object, a reinforcing tape of the present invention is a reinforcing tape in a belt form, which is made to adhere to a belt-form insulating tape so as to be laminated thereon, to reinforce the insulating tape in a manufacturing process, and has second holes used for removing a part of the reinforcing tape from the insulating tape after the adhesion.

With the foregoing configuration wherein the reinforcing tape has the second holes for separation use, it is possible to remove the reinforcing tape from the insulating tape along the lines of the separation-use second holes, after installation of the semiconductor elements on the insulating tape in the process of fabrication (or before such step). Therefore, after each semiconductor element and each wire pattern connected therewith are cut out as a semiconductor device, a step of removing the reinforcing tape from each semiconductor device is unnecessary. Therefore, the process of fabrication can be simplified.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) is a plan view illustrating a configuration of the foregoing tape carrier, and FIGS. 2(b) through 2(d) show respective cross sections taken along an E-1 line, an F-1 line, and a G-1 line.

FIGS. 3(a) through 3(f) are plan views illustrating a process of fabrication of the foregoing tape carrier.

FIGS. 4(a) through 4(f) are cross-sectional views illustrating the foregoing process of fabrication of the tape carrier.

FIG. 5 is a cross-sectional view illustrating a configuration of a liquid crystal display device in which a semiconductor device of the foregoing tape carrier is provided therein in a bent state.

FIG. 6(a) is a plan view illustrating a configuration of a tape carrier in accordance with another embodiment of the present invention, and FIGS. 6(b) through 6(d) show respective cross sections taken along an E-2 line, an F-2 line, and a G-2 line.

FIGS. 7(a) through 7(f) are plan views illustrating a process of fabrication of the tape carrier shown in FIG. 6(a).

FIGS. 8(a) through 8(f) are cross-sectional views illustrating the process of fabrication of the tape carrier shown in FIG. 6(a).

FIG. 9(a) is a plan view illustrating a configuration of a tape carrier in accordance with still another embodiment of the present invention.

FIGS. 9(b) through 9(d) show respective cross sections taken along an E-3 line, an F-3 line and a G-3 line.

FIGS. 10(a) through 10(f) are plan views illustrating a process of fabrication of the tape carrier shown in FIG. 9(a).

FIG. 11(a) is a plan view illustrating another configuration of the tape carrier shown in FIG. 9(a), and FIGS. 11(b) through 11(d) show respective cross sections taken along an E-4 line, an F-4 line, and a G-4 line.

FIG. 12(a) is a plan view illustrating a configuration of a tape carrier in accordance with still another embodiment of the present invention, and FIGS. 12(b) through 12(d) show respective cross sections taken along an E-5 line, an F-5 line, and a G-5 line.

FIGS. 13(a) through 13(e) are plan views illustrating a process of fabrication of the tape carrier shown in FIG. 12(a).

FIGS. 14(a) through 14(e) are cross-sectional views illustrating the process of fabrication of the tape carrier shown in FIG. 12(a).

FIG. 15(a) is a plan view illustrating another configuration of the tape carrier shown in FIG. 12(a), and FIGS. 15(b) through 15(d) show respective cross sections taken along an E-6 line, an F-6 line, and a G-6 line.

FIG. 16(a) is a plan view illustrating a configuration of a tape carrier in accordance with still another embodiment of the present invention, and FIGS. 16(b) through 16(d) shown respective cross sections taken along an E-7 line, an F-7 line, and a G-7 line.

DESCRIPTION OF THE PREFERRED EMBODIMENTS

[First Embodiment]

The following description will explain an embodiment of the present invention while referring to FIGS. 1(a) through 5.

Figure 1A:
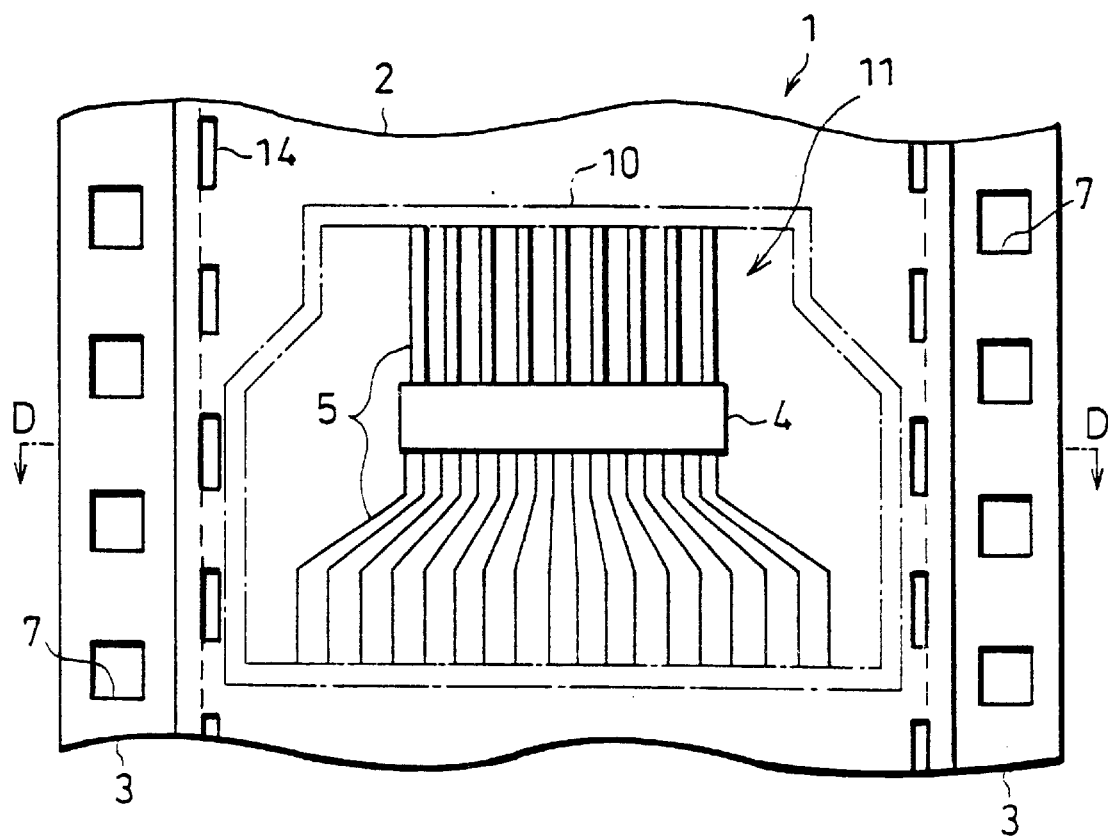
FIG. 1(a) is a plan view illustrating a configuration of a tape carrier in accordance with an embodiment of the present invention.
Figure 1B:
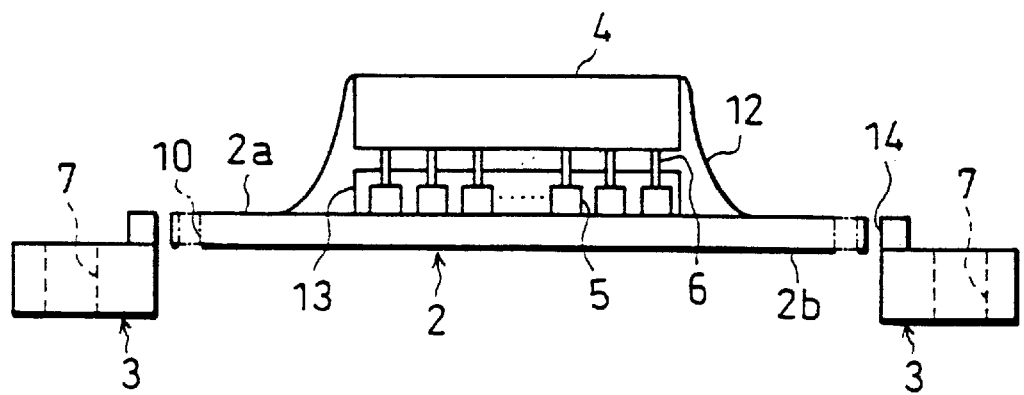
FIG. 1(b) is shows a cross section along a D-D line.

A tape carrier 1 as a semiconductor apparatus in accordance with the present invention is composed of a thin film insulating tape 2, and reinforcing tapes (reinforcing members) 3 which are relatively thick films provided on both side portions of the insulating tape 2, as shown in FIGS. 1(a) and 1(b).

The insulating tape 2 is formed with a thin film with a thickness of 10 μm to 25 μm so as to have flexibility. The insulating tape 2 can be formed with, for example, polyimide-based resin.

The insulating tape 2 has a region (hereinafter referred to as "device recion") 11 which is cut out along a cutout line 10 so as to be used as an independent semiconductor device. Moreover, the insulating tape 2 is formed in a belt shape as shown in FIG. 2(a), in which device regions 11 are provided at uniform spaces in a lengthwise direction.

In each device region 11, an IC chip (semiconductor element) 4 is installed, and a predetermined wire pattern 5 made of a metal film is provided. Wires of the wire pattern 5 are electrically connected with corresponding electrode terminals 6 of the IC chip 4, respectively, as shown in FIG. 1(b). Connections of wires of the wire pattern 5 with the IC chip 4 are sealed with resin 12. Exposed parts of the wire pattern 5, except connector sections at ends which are, upon use, to be connected with another substrate or the like, are coated with solder resist 13 so that a state of insulation is secured. Incidentally, the resin 12 and the solder resist 13 are omitted in some drawings including FIGS. 1(a) and 2(a). In FIG. 2(a) and other drawings, a part of the wire pattern 5 is omitted.

The IC chip 4 is installed on a surface 2a of the insulating tape 2, and the tape 2 has no opening for IC chip installation use (usually called "device hole") which is provided for installation of the IC chip 4. In other words, under an entirety of the IC chip 4, exists the insulating tape 2. Further, an entirety of each wire of the wire pattern 5 is made to adhere to the surface 2a of the insulating tape 2 so as to be fixed thereto, so that the connections thereof with the IC chip 4 are also fixed on the surface 2a of the insulating tape 2.

Incidentally, each side portion of the insulating tape 2 has perforations (third holes) 14 so as to make a line, which will be described later.

The reinforcing tapes 3 are provided in a belt form each on both side portions of the insulating tape 2, being made to adhere to the other surface 2b of the insulating tape 2 with an adhesive. The reinforcing tape 3 has holes 7 called "sprocket holes" at uniform spaces which are to be used in transport. These sprocket holes 7 help accurate and secure transport of the insulating tape 2, in fabrication of the tape carrier 1. The reinforcing tape 3 is formed with a relatively thick film with a thickness of 50 μm to 75 μm so that the sprocket holes 7 may not be broken while being transported, which film is made of polyimide-based resin.

As described above, the tape carrier 1 has the device regions 11 at uniform spaces in the lengthwise direction. Each device region 11 is to be cut out along the cutout line 10 so that each is used as an independent semiconductor device applicable to various devices. For example, as shown in FIG. 5, an independent semiconductor device 20 thus cut out can be applied to a liquid crystal display (LCD) device 25 composed of a liquid crystal panel 21, a printed circuit substrate 22, a backlight 23, and a bezel 24, so as to be disposed and used between the liquid crystal panel 21 and the printed circuit substrate 22 in a bent state.

More specifically, the tape carrier 1 is formed with a thin film with a thickness of 10 μm to 25 μm, so as to be flexible at any part. Therefore, as shown in FIG. 5, an independent semiconductor 20 thus cut out therefrom can be provided and used in a bent state.

Further, since the tape carrier 1 has the sprocket holes 7 in the reinforcing tapes 3, it is possible to accurately transport the insulating tape 2, when the wire patterns 5 are formed on the insulating tape 2, as well as when the IC chips 4 are installed on the insulating tape 2. Since the reinforcing tape 3 is formed with a thick film with a thickness of 50 μm to 75 μm, the sprocket holes 7 are hardly broken while transported.

Furthermore, in the tape carrier 1, a tape with a width equal to that of a TCP-use carrier tape of the current standard is used to form the reinforcing tape 3. More specifically, the reinforcing tape 3 is formed with any one of 35 mm-wide, 48 mm-wide, and 70 mm-wide tapes. Therefore, facilities used for fabrication of conventional TPCs can be used for fabrication of the tape carriers 1.

The following description will explain a method of fabrication of the tape carrier 1, while referring to FIGS. 3(a) through 4(f).

To start with, as shown in FIG. 3(a), sprocket holes (first holes) 7 are formed on both side portions of a 50 μm to 75 μm-thick polyimide film which is to be used as the reinforcing tape 3. Further, on an inner side to the sprocket holes 7, separation-use perforations (second holes) 31 are formed. In addition, in order that separation is surely performed in a separation step which will be described afterwards, bores (openings) 32 are formed, each to a size substantially equal to the size of the IC chip 4, at a position corresponding to a position at which the IC chip 4 is to be installed later. The reason why the bores 32 are formed in the polyimide film 30 is that the polyimide film 30 and a copper foil-laminated film 33 tend to firmly adhere to each other in the vicinity of IC-chip-installed areas due to heat generated therearound in the process of installing the IC chip 4, thereby likely causing separation to become difficult without the bores 22.

On the other hand, a copper foil-laminated film 33 to be used as the insulating tape 2 is prepared. The copper foil-laminated film 33 is a film obtained by laminating a copper foil 35 with a thickness of about 8 μm-18 μm on one entire surface of an insulating film 34 with a thickness of 10 μm-25 μm. The copper foil-laminated film 33 has a width P which is smaller than a distance Q from the sprocket holes 7 on one side to those on the other side, and is greater than a distance R from the separation-use perforations 31 on one side to those on the other side.

FIG. 4(a) shows respective cross sections along an a-11 line, an a-12 line, and an a-13 line of FIG. 3(a).

Subsequently, as shown in FIG. 3(b), the copper foil-laminated film 33 is made to adhere to a polyimide film 30 with an adhesive, so that the copper foil-laminated film 33 is laminated on a surface of the polyimide film 30, in a manner such that: a surface of the copper foil-laminated film 33 on the insulating film 34 side is in contact with the polyimide film 30; the separation-use perforations 31 are covered with the copper foil-laminated film 33; and the sprocket holes 7 on both the side portions of the polyimide film 30 are not covered with the copper foil-laminated film 33.

For adhesion between the polyimide film 30 and the copper foil-laminated film 33, a heat-hardening adhesive or a UV-hardening adhesive is preferably used. Use of such an adhesive for adjusting adhesion conditions including adhesion temperature and adhesion time enables free adjustment of an adhesive force to a level allowing separation between the films 30 and 33 in a good state in the subsequent separation step.

FIG. 4(b) shows respective cross sections along a b-11 line and a b-12 line of FIG. 3(b).

Subsequently, as shown in FIG. 3(c), predetermined wire patterns 5 are formed on the copper foil-laminated film 33. The wire patterns 5 are formed by etching the copper foil 35 on the insulating film 34 to a predetermined pattern. In formation of the wire patterns 5, the tape is transported with use of the sprocket holes 7, so that a plurality of wire patterns 5 are sequentially formed in a lengthwise direction of the tape.

After the formation of the wire pattern 5, the perforations (third holes) 14 are formed by boring both the polyimide film 30 and the insulating film 34. Each perforation 14 is formed at a position between neighboring separation-use perforations 31, to bridge both the neighboring separation-use perforations 31. This results in that all the separations-use perforations 31 are continued with each other on either side, thereby causing the edge parts having the sprocket holes 7 and an inside part 36 which will be described later, of the polyimide film 30 to become in a separated state.

FIG. 4(c) shows respective cross sections along a c-11 line and a c-12 line of FIG. 3(c).

Subsequently, as shown in FIG. 3(d), a plurality of IC chips 4 are installed on the copper foil-laminated film 33 at uniform spaces in the lengthwise direction, so as to be respectively electrically connected with corresponding wire patterns 5. Following to the installation of the IC chips 4, connections of the IC chips 4 with the wire patterns 5 are sealed with resin 12, and solder resist 13 is applied to the wire patterns 5 at areas requiring application of the solder resist 13.

FIG. 4(d) shows cross sections along a d-11 line and a d-12 line in FIG. 3(d).

Thereafter, as shown in FIG. 3(e), the inside part 36 of the polyimide film 30, which is the part between the separation-use perforations 31 on the side portions, is wound and taken out, thereby separating from the copper foil-laminated film 33. Consequently, the tape carrier 1 composed of the insulating tape 2 and the reinforcing tapes 3 is completed. FIG. 4(e) shows respective cross sections along an e-11 line, an e-12 line, and an e-13 line of FIG. 3(e).

A plurality of semiconductor devices 20 formed on the tape carrier 1 are cut out from the tape carrier 1 one by one as shown in FIG. 3(f), and each is independently used as a semiconductor device, being applied to a liquid crystal display device or the like, as described above. FIG. 4(f) shows respective cross sections along an f-11 line and an f-12 line of FIG. 3(f).

According to the foregoing method, the polyimide film 30 having the sprocket holes 7 and the copper foil-laminated film 33 are laminated with each other and the sprocket holes 7 are used in transport and position adjustment of the same, thereby facilitating the handling. Further, since the inside part 36 of the polyimide film 30 is separated before the semiconductor devices 20 are cut out from the tape carrier 1, a step of removing the reinforcing tapes from each semiconductor device 20 thus cut out is unnecessary.

Incidentally, in the foregoing method of fabrication, the perforations 14 are formed after the formation of the wire pattern 5, but the present invention is not specifically limited to this. The perforations 14 may be formed before the formation of the wire pattern 5, or the perforations 14 may be formed after the installation of the IC chip 4.

Furthermore, in the foregoing method of fabrication, the bores 32 are formed in the step shown in FIG. 3(a), but the step of forming the bores 32 may be omitted. More specifically, in the case where the separations can be executed in a good state without the bores 32 by setting lower the temperature upon installation of the IC chip 4 or changing the adhesive and adhesion conditions in adhesion of the polyimide film 30 to the copper foil-laminated film 33, the step of forming the bores 32 can be omitted. This further simplifies the process of fabrication.

[Second Embodiment]

The following description will explain another embodiment of the present invention while referring to FIGS. 6(a) through 8(f). Incidentally, the members having the same structure (function) as those in the above-mentioned embodiment will be designated by the same reference numerals and their description will be omitted.

As shown in FIGS. 6(a) through 6(d), a tape carrier 40 of the present embodiment differs from the tape carrier 1 of the first embodiment in that an insulating tape 41 is formed wider and the sprocket holes 7 are formed in the insulating tape 41 as well. Except this, the tape carrier 40 of the present embodiment is identical to the tape carrier 1 of the first embodiment.

As will be described afterwards, the sprocket holes 7 of the insulating tape 41 are formed by simultaneously boring a polyimide film 42 to be used as the reinforcing tape 3 and a copper foil-laminated film 43 to be used as the insulating tape 41 which are laminated on each other, through the same step through which the sprocket holes 7 of the reinforcing tape 3 are formed. Therefore, the sprocket holes 7 of the insulating tape 41 are exactly superimposed on the sprocket holes 7 of the reinforcing tapes 3.

The tape carrier 40 is designed so that a larger area can be used for adhesion between the reinforcing tapes 3 and the insulating tape 41, thereby resulting in that the adhesion between the films 3 and 41 can be maintained in good conditions. Since the sprocket holes 7 are provided not only in the reinforcing tapes 3 but also in the insulating tape 41, transport in the process of fabrication can be executed in a good state, while damage to the sprocket holes 7 which tends to occur during transport can be surely prevented.

The following description will explain a method of fabrication of the tape carrier 40, while referring to FIGS. 7(a) through 8(f).

To start with, as shown in FIG. 7(a), separation-use perforations 31 are formed on both side portions of a 50 μm to 75 μm-thick polyimide film 42 which is to be used as the reinforcing tape 3. The separation-use perforations 31 are formed on an inner side to the sprocket holes 7, which are to be formed afterwards. In addition, like in the first embodiment, bores 32 are formed, each to a size substantially equal to the size of the IC chip 4, at a position corresponding to a position at which the IC chip 4 is to be installed later.

Then, a copper foil-laminated film 43 to be used as the insulating tape 41 is prepared. The copper foil-laminated film 43 is a film obtained by laminating a copper foil 35 with a thickness of about 8 μm-18 μm on one entire surface of an insulating film 34 with a thickness of 10 μm-25 μm. The copper foil-laminated film 43 has a width S which is substantially equal to a width T of the polyimide film 42.

FIG. 8(a) shows respective cross sections along an a-21 line, an a-22 line, and an a-23 line of FIG. 7(a).

Subsequently, as shown in FIG. 7(b), the copper foil-laminated film 43 is made to adhere to the polyimide film 42 with an adhesive, so that the copper foil-laminated film 43 is laminated on a surface of the polyimide film 42, in a manner such that a surface of the copper foil-laminated film 43 on the insulating film 34 side is in contact with the polyimide film 42. For adhesion between the polyimide film 42 and the copper foil-laminated film 43, a heat-hardening adhesive or a UV-hardening adhesive is preferably used, as in the first embodiment.

FIG. 8(b) shows respective cross sections along a b-21 line and a b-22 line of FIG. 7(b).

Subsequently, as shown in FIG. 7(c), both side portions of the polyimide film 42 and the copper foil-laminated film 43 thus laminated on each other are simultaneously bored, so that the sprocket holes 7 are formed in the polyimide film 42 and the copper foil-laminated film 43 simultaneously through the one and same step. Subsequently, as in the first embodiment, after the formation of the predetermined wire patterns 5, the perforations 14 are formed, in a manner such that each perforation 14 is formed at a position between neighboring separation-use perforations 31, to bridge the neighboring separation-use perforations 31. This results in that all the separations-use perforations 31 are continued with each other on either side, thereby causing edge parts having the sprocket holes 7 and an inside part 36 which will be described later, of the polyimide film 42 to become in a separated state.

FIG. 8(c) shows respective cross sections along a c-21 line and a c-22 line of FIG. 7(c).

Subsequently, as shown in FIG. 7(d), as in the first embodiment, a plurality of IC chips 4 are installed on the copper foil-laminated film 43 at uniform spaces in the lengthwise direction. FIG. 8(d) shows respective cross sections along a d-21 line and a d-22 line of FIG. 7(d).

Thereafter, as shown in FIG. 7(e), the inside part 36 of the polyimide film 42, which is the part between the separation-use perforations 31 on the side portions, is wound and taken out, thereby separating from the copper foil-laminated film 43. Consequently, the tape carrier 40 composed of the insulating tape 41 and the reinforcing tapes 3 is completed. FIG. 8(e) shows respective cross sections along an e-21 line, an e-22 line, and an e-23 line of FIG. 7(e).

A plurality of semiconductor devices 20 formed on the tape carrier 40 are cut out from the tape carrier 40 one by one as shown in FIG. 7(f), and each is independently used as a semiconductor device, being applied to a liquid crystal display device or the like, as described above. FIG. 8(f) shows respective cross sections along an f-21 line and an f-22 line of FIG. 7(f).

According to the foregoing method, like in the first embodiment, the sprocket holes 7 are used in transport and position adjustment, thereby facilitating the handling. Further, since the inside part 36 of the polyimide film 42 is separated before the semiconductor devices 20 are cut out from the tape carrier 40, a step of removing the reinforcing tapes from each semiconductor device 20 thus cut out is unnecessary.

Incidentally, in the foregoing method of fabrication, the perforations 14 are formed after the formation of the wire patterns 5, but the present invention is not specifically limited to this. The perforations 14 may be formed before the formation of the wire patterns 5, or the same may be formed after the installation of the IC chips 4.

Furthermore, in the foregoing method of fabrication, the bores 32 are formed in the step shown in FIG. 7(a), but the step of forming the bores 32 may be omitted, as in the first embodiment.

[Third Embodiment]

The following description will explain still another embodiment of the present invention, while referring to FIGS. 9(a) through 11(d). Incidentally, the members having the same structure (function) as those in the above-mentioned embodiments will be designated by the same reference numerals and their description will be omitted.

A tape carrier 50 in accordance with the present embodiment differs from the tape carrier 40 of the second embodiment in that the reinforcing tapes 3 and the insulating tape 41 are made to adhere to each other on a side on which IC chips 4 and wire patterns 5 are provided, in a manner such that a copper foil 35 becomes an interface between the reinforcing tapes 3 and the insulating tape 41, as shown in FIGS. 9(a) through 9(d). Except this, the tape carrier 50 of the present embodiment is identical to the tape carrier 40 of the second embodiment.

As will be described later, in the case where a copper foil-laminated film 53 over whose one entire surface a copper foil 35 is made to adhere is used as the insulating tape 41, it is sometimes preferable in fabrication, from the viewpoint of adhesiveness such as strength of adhesion, to make the copper foil 35 side surface of the copper foil-laminated film 53 adhere to the polyimide film 52 as the reinforcing tape 3, rather than to make the insulating film 34 side surface of the copper foil-laminated film 53 adhere to the polyimide film 52. From this viewpoint, the tape carrier 50 is designed so that the reinforcing tape 3 and the insulating tape 41 are made to adhere to each other with the copper foil 35 as an interface therebetween.

The following description will explain a method of fabrication of the tape carrier 50, while referring to FIG. 10.

To start with, as shown in FIG. 10(a), separation-use perforations 31 are formed on both side portions of a 50 μm to 75 μm-thick polyimide film 52 which is to be used as the reinforcing tape 3. The separation-use perforations 31 are formed on an inner side to the sprocket holes 7 which are to be formed afterwards. Unlike in the first and second embodiments, bores 32 are not formed in the present embodiment.

On the other hand, a copper foil-laminated film 53 to be used as the insulating tape 41 is prepared. The copper foil-laminated film 53 is a film obtained by laminating a copper foil 35 with a thickness of about 8 μm-18 μm on one entire surface of an insulating film 34 with a thickness of 10 μm-25 μm. The copper foil-laminated film 53 has a width S which is substantially equal to a width T of the polyimide film 52.

Subsequently, as shown in FIG. 10(b), the polyimide film 52 is made to adhere to the copper foil-laminated film 53 with an adhesive, so that the polyimide film 52 is laminated on a surface of the copper foil-laminated film 53, in a manner such that the polyimide film 52 is in contact with a surface of the copper foil-laminated film 53 on the copper foil 35 side. In other words, the polyimide film 52 is laminated on the copper foil 35 of the copper foil-laminated film 53. For adhesion between the polyimide film 52 and the copper foil-laminated film 53, a heat-hardening adhesive or a UV-hardening adhesive is preferably used, as in the first embodiment.

Subsequently, as shown in FIG. 10(c), like in the second embodiment, the sprocket holes 7 are formed in the polyimide film 52 and the copper foil-laminated film 53 simultaneously through the one and same step. Subsequently, in the present embodiment, the perforations 14 are formed in a manner such that each perforation 14 is formed at a position between neighboring separation-use perforations 31 so as to bridge the neighboring separation-use perforations 31. This results in that all the separations-use perforations 31 are continued with each other on either side, thereby causing edge parts having the sprocket holes 7 and an inside part 36 which will be described later, of the polyimide film 52 to become in a separated state.

Thereafter, as shown in FIG. 10(d), the inside part 36 of the polyimide film 52, which is the part between the separation-use perforations 31 on the side portions, is wound and taken out, thereby separating from the copper foil-laminated film 53.

Thereafter, as shown in FIG. 10(e), after the predetermined wire patterns 5 are formed on the copper foil-laminated film 53, a plurality of IC chips 4 are installed on the copper foil-laminated film 53 at uniform spaces in the lengthwise direction. The formation of the wire patterns 5 and the installation of the IC chips 4 are performed in the same manner as that in the first embodiment. Consequently, the tape carrier 50 composed of the insulating tape 41 and the reinforcing tapes 3 is completed.

A plurality of semiconductor devices 20 formed on the tape carrier 50 are cut out from the tape carrier 50 one by one as shown in FIG. 10(f), and each is independently used as a semiconductor device, being applied to a liquid crystal display device or the like, as described above.

According to the foregoing method, like in the first and second embodiments, the sprocket holes 7 are used in transport and position adjustment, thereby facilitating the handling. Further, since the inside part 36 of the polyimide film 52 is separated before the semiconductor devices 20 are cut out from the tape carrier 50, a step of removing the reinforcing tapes from each semiconductor device 20 thus cut out is unnecessary.

Incidentally, this embodiment may be modified so that, as shown in FIGS. 11(a) through 11(d), the reinforcing tapes 3 and the insulating tape 2 are made to adhere to each other with the copper foil 35 as an interface therebetween, on a side on which the IC chips 4 and the wire patterns 5 are provided, and that the insulating tape 2 is formed narrower and does not have sprocket holes.

[Fourth Embodiment]

The following description will explain still another embodiment while referring to FIGS. 12(a) through 15(d). Incidentally, the members having the same structure (function) as those in the above-mentioned embodiments will be designated by the same reference numerals and their description will be omitted.

A tape carrier 60 in accordance with the present embodiment differs from the tape carrier 40 of the second embodiment in that the tape carrier 60 is, as shown in FIGS. 12(a) through 12(d), designed so that provision of reinforcing tapes 61 is not limited to the side portions on the both sides, but the reinforcing tapes 61 are extended to areas between the device regions 11 to surround each of the device regions 11, in a manner such that each surrounded area becomes in a rectangular shape. Besides, in the tape carrier 60, perforations 14 are not provided in the insulating tape 41. Except these, the tape carrier 60 of the present embodiment is identical to the tape carrier 40 of the second embodiment.

In the case of the tape carrier 60, since the reinforcing tapes 61 are not limited to the side portions but are extended to each area between neighboring device regions 11, the effect of reinforcement is augmented. Besides, as will be described afterwards, without the step of removing the reinforcing tape 61 from the insulating tape 41, the process of fabrication is simplified.

The following description will explain a method of fabrication of the tape carrier 60, while referring to FIGS. 13(a) through 14(e).

To start with, as shown in FIG. 13(a), device-corresponding holes (fourth holes) 64 are formed in a center portion of a polyimide film 62 with a thickness of 50 μm to 75 μm to be used as the reinforcing tape 61, in a lengthwise direction at uniform spaces. In other words, the device-corresponding holes 64 correspond to regions where the semiconductor devices 20 are to be formed. Unlike in the foregoing first through third embodiments, separation-use perforations 31 are not formed.

On the other hand, a copper foil-laminated film 63 to be used as the insulating tape 41 is prepared. The copper foil-laminated film 63 is a film obtained by laminating a copper foil 35 with a thickness of about 8 μm-18 μm on one entire surface of an insulating film 34 with a thickness of 10 μm-25 μm. The copper foil-laminated film 63 has a width S which is substantially equal to a width T of the polyimide film 62.

FIG. 14(a) shows respective cross sections along an a-31 line, an a-32 line, and an a-33 line of FIG. 13(a).

Next, as shown in FIG. 13(b), the copper foil-laminated film 63 is made to adhere to the polyimide film 62 with an adhesive, so that the copper foil-laminated film 63 is laminated on a surface of the polyimide film 62, in a manner such that a surface of the copper foil-laminated film 63 on the insulating film 34 side is in contact with the polyimide film 62. For adhesion between the polyimide film 62 and the copper foil-laminated film 63, a heat-hardening adhesive or a UV-hardening adhesive is preferably used, as in the first embodiment.

FIG. 14(b) shows respective cross sections along a b-31 line and a b-32 line of FIG. 13(b).

Subsequently, as shown in FIG. 13(c), both side portions of the polyimide film 62 and the copper foil-laminated film 63 thus laminated on each other are simultaneously bored, so that the sprocket holes 7 are formed in the polyimide film 62 and the copper foil-laminated film 63 simultaneously through the one and same step. Then, predetermined wire patterns 5 are formed at regions corresponding to the device-corresponding holes 64 of the copper foil-laminated film 63. The formation of the wire patterns 5 is performed in the same manner as that in the first embodiment.

FIG. 14(c) shows respective cross sections along a c-31 line and a c-32 line of FIG. 13(c).

Subsequently, as shown in FIG. 13(d), as in the first embodiment, a plurality of IC chips 4 are installed on the copper foil-laminated film 63 at uniform spaces in the lengthwise direction. Consequently, the tape carrier 60 composed of the insulating tape 41 and the reinforcing tapes 62 is completed. A plurality of semiconductor devices 20 formed on the tape carrier 60 are cut out from the tape carrier 60 one by one as shown in FIG. 13(e) and each is independently used as a semiconductor device, being applied to a liquid crystal display device or the like, as described above.

Incidentally, FIG. 14(d) shows respective cross sections along a d-31 line and a d-32 line of FIG. 13(d), and FIG. 14(e) shows respective cross sections along an e-31 line and an e-32 line of FIG. 13(e).

According to the foregoing method, like in the first and second embodiments, the sprocket holes 7 are used in transport and position adjustment, thereby facilitating the handling. Further, since the device-corresponding holes 64 are formed in the polyimide film 62, a step of removing the reinforcing tapes from each semiconductor device 20 thus cut out is unnecessary, which means that a step of removing the polyimide film 62 is unnecessary in the process of fabrication. Therefore, the process of fabrication is simplified.

Incidentally, this embodiment may be modified so that, as shown in FIGS. 15(a) through 15(d), the reinforcing tapes 61 may be provided as if forming borders, not to surround each of the device regions 11 in a manner such that each surrounded area becomes in a rectangular shape, but to be further extended to an outline of each device region 11.

[Fifth Embodiment]

The following description will explain still another embodiment of the present invention, while referring to FIGS. 16(a) through 17(d). Incidentally, the members having the same structure (function) as those in the above-mentioned embodiments will be designated by the same reference numerals and their description will be omitted.

A tape carrier 70 in accordance with the present embodiment is designed so that reinforcing tapes 71 are provided not only in side portions on both sides thereof, but also island-like reinforcing tapes 71 are provided in areas between neighboring device regions 11. Further, the reinforcing tapes 71 are formed with metal films. Except these, the tape carrier 70 of the present embodiment is identical to the tape carrier 60 of the fourth embodiment.

In the case of the tape carrier 70, since the reinforcing tapes 71 are not limited to the side portions but are also provided in areas between the device regions 11 like islands, the effect of reinforcement is augmented. Besides, as will be described afterwards, without the step of removing the reinforcing tape 71 from the insulating tape 41, the process of fabrication is simplified. Furthermore, since the step of making the polyimide film adhere to the copper foil-laminated film can be omitted, the process of fabrication is further simplified.

The following description will explain a method of fabrication of the tape carrier 70, while referring to FIGS. 17(a) through 17(d).

Figure 17A:
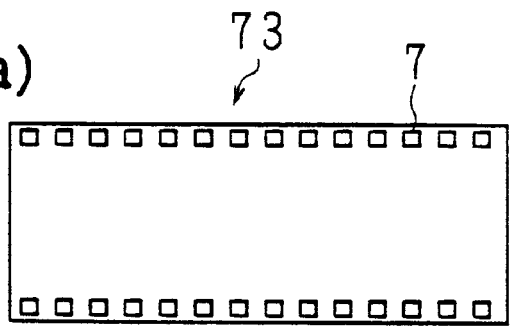
FIGS. 17(a) through 17(d) are plan view illustrating a process of fabrication of the tape carrier shown in FIG. 16(a).

To start with, as shown in FIG. 17(a), a double-sided copper foil-laminated film 73 as a material of the tape carrier 70 is prepared. The double-sided copper foil-laminated film 73 is a film obtained by laminating a copper foil 35 with a thickness of about 8 $\mu$m-18 $\mu$m on an entirety of each of surfaces of an insulating film 34 with a thickness of 10 $\mu$m-25 $\mu$m. Note that the thickness of each copper film 35 may be thicker than the above, or the thickness thereof on one surface may be different from that on the other surface. On both side portions of the double-sided copper foil-laminated film 73, sprocket holes 7 are formed at uniform spaces in the lengthwise direction.

Figure 17B:
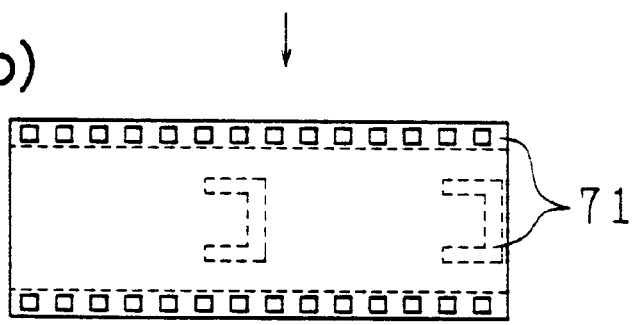

Next, as shown in FIG. 17(b), one of the copper foils 35 on the surfaces of the double-sided copper foil-laminated film 73 is subjected to etching, so that reinforcing tapes 71 made of the copper foil 35 are formed on one surface of the insulating film 34.

Figure 17C:
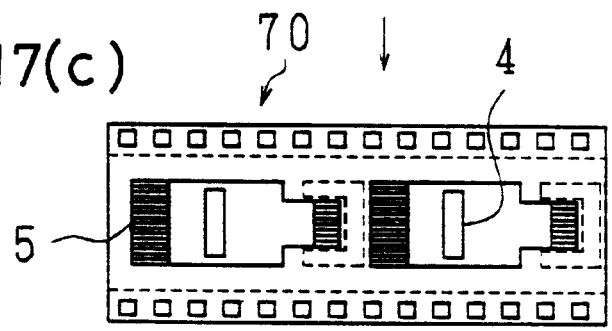
Figure 17D:
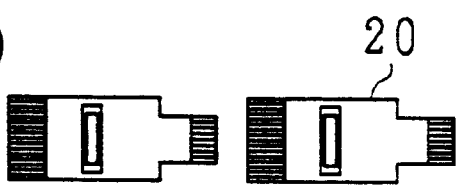
Figure 18:
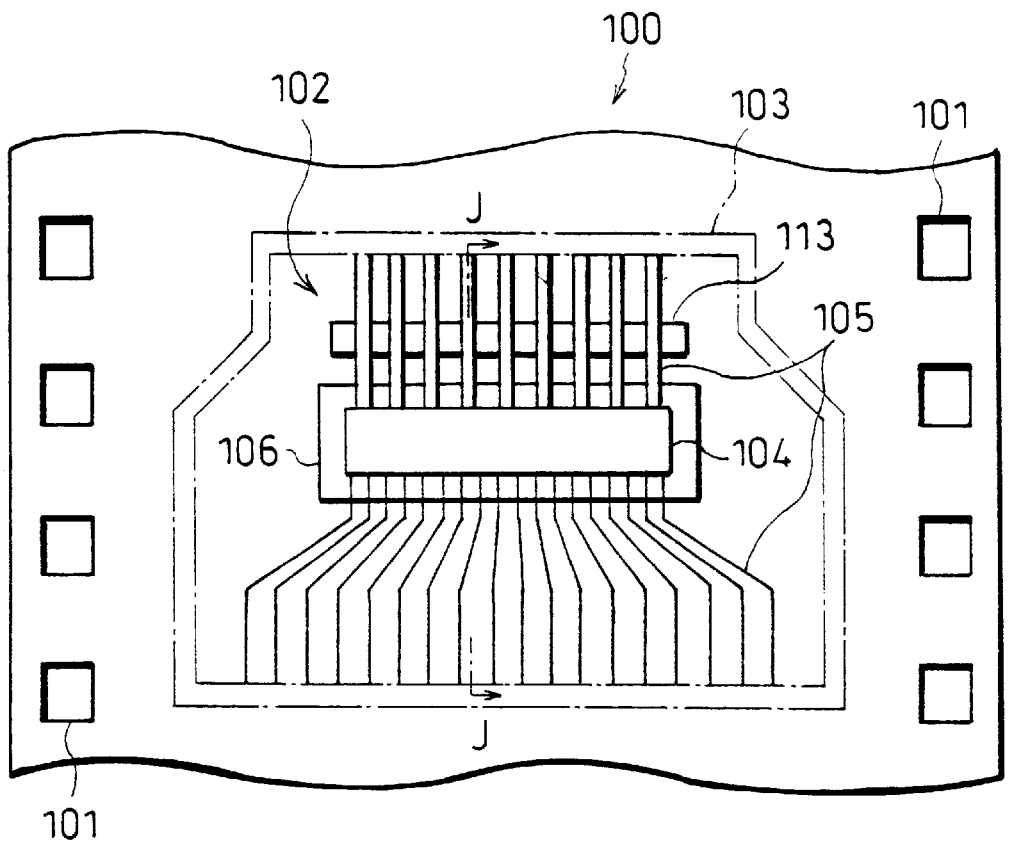
FIG. 18(a) is a plan view illustrating a configuration of a conventional TCP-use tape carrier.
FIG. 18(b) shows a cross section taken along a J-J line.
Figure 18:
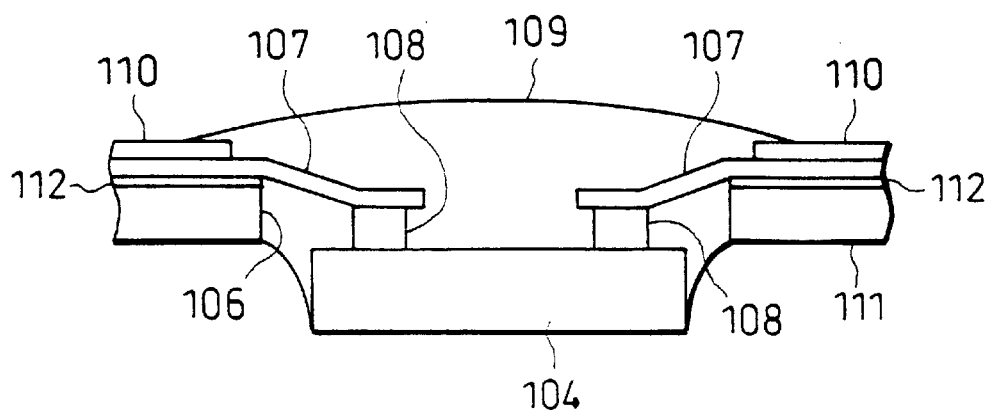
Figure 19A:
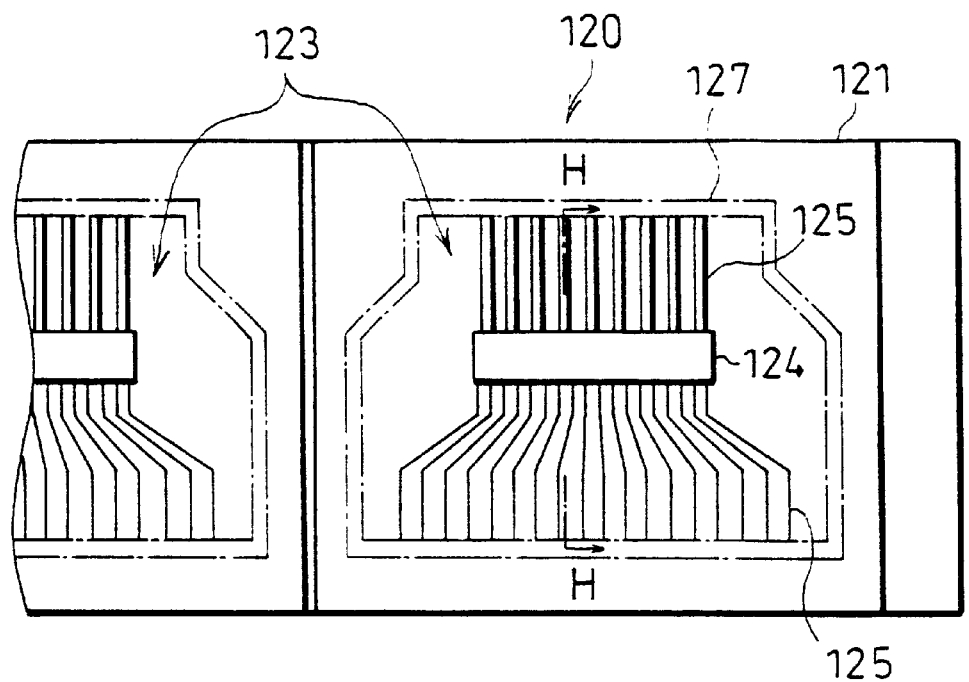
FIG. 19(a) is a plan view illustrating a configuration of a conventional COF-use tape carrier.
Figure 19B:
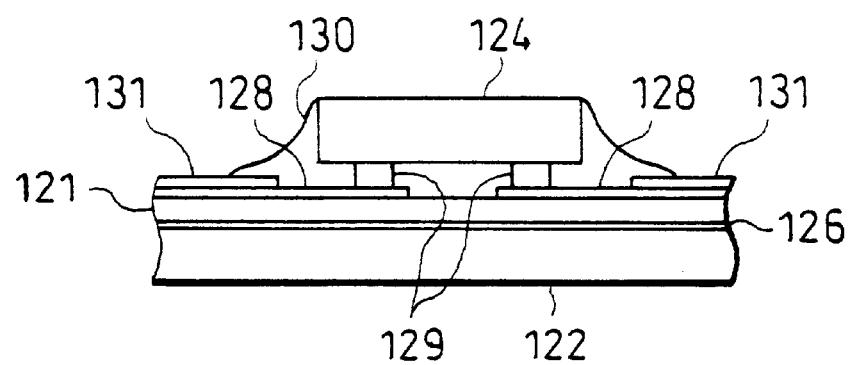
FIG. 19(b) shows a cross section taken along an H-H line.

Thereafter, as shown in FIG. 17(c), predetermined wire patterns 5 are formed on the other surface of the double-sided copper foil-laminated film 73. The formation of the wire patterns 5 may be performed by etching the copper foil 35 on the other surface of the insulating film 34 to predetermined patterns, like in the first embodiment. Subsequently, as in the first embodiment, a plurality of IC chips 4 are installed on the copper foil-laminated film 73 at uniform spaces in the lengthwise direction. Consequently, the tape carrier 70 composed of the insulating tape 41 and the reinforcing tapes 71 is completed. A plurality of semiconductor devices 20 formed on the tape carrier 70 are cut out from the tape carrier 70 one by one as shown in FIG. 17(d) and each is independently used as a semiconductor device, being applied to a liquid crystal display device or the like, as described above.

According to the foregoing method, like in the first and second embodiments, the sprocket holes 7 are used in transport and position adjustment, thereby facilitating the handling. Further, a step of removing the reinforcing tapes from each semiconductor device 20 thus cut out is unnecessary, which means that a step of removing the polyimide film and a step of making the polyimide film adhere to the copper foil-laminated film can be omitted from the process of fabrication. Therefore, the process of fabrication is further simplified.

Incidentally, the shapes of the reinforcing tapes 71 are not limited to the shapes shown in the figures. The reinforcing tapes 71 may be obtained by etching to shapes of the reinforcing tapes in accordance with any one of the first through fourth embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

As described above, a semiconductor apparatus of the present invention, which includes a thin film belt-like insulating tape having a plurality of predetermined wire patterns thereon, and a plurality of semiconductor elements provided on a surface of the insulating tape at uniform spaces in a lengthwise direction and electrically connected with the wire patterns, is designed so as to further include a thick film reinforcing member with holes for transport use provided at uniform spaces, the reinforcing member being provided on both side portions of the insulating tape, in the lengthwise direction.

In the semiconductor apparatus of the present invention, the foregoing reinforcing member is preferably also provided in each area that is between neighboring semiconductor elements, outside semiconductor element-installed regions, and outside wire pattern-formed regions. With this, the reinforcing property of the reinforcing member improves, thereby further facilitating the handling of the apparatus during fabrication. On the other hand, since the reinforcing member is not provided in the semiconductor element-installed regions and the wire pattern-formed regions, a step of removing the reinforcing tape from each semiconductor device is unnecessary after each semiconductor element and each wire pattern connected therewith are cut out as a semiconductor device. Therefore, the process of fabrication is simplified.

Further, in the semiconductor apparatus of the present invention, the holes of the reinforcing member are preferably positioned on an outer side to an edge of the insulating tape. This ensures that transport and position adjustment can be executed with use of the holes of the reinforcing member positioned on an outer side to an edge of the insulating tape. Further, since the insulating tape can be formed narrower than the reinforcing member, costs of materials can be reduced.

Further, in the semiconductor apparatus of the present invention, the insulating tape preferably has holes for transport use, which are provided at uniform spaces in both side portions thereof and correspond to the holes of the reinforcing member, and the holes of the insulating tape are superimposed on the holes of the reinforcing member. This enables areas around the holes of the insulating tape and areas around the holes of the reinforcing member to adhere to each other. As a result, large areas for adhesion between the insulating tape and the reinforcing member are secured, whereby workability in the fabrication is further enhanced.

As described above, a method of fabrication of a semiconductor apparatus of the present invention comprises the steps of (1) forming first holes for transport use, on both sides of a reinforcing tape formed with a thick film, at uniform spaces in a lengthwise direction of the reinforcing tape, and forming second holes for separation use so as to make lines in the lengthwise direction, on both sides of the reinforcing tape and on inner sides to the first holes, (2) making an insulating tape, formed with a thin film narrower than a distance from the first holes on one side to those on the other side, adhere onto an inside part of the reinforcing tape so as to cover the second holes on both the sides, (3)

providing a plurality of predetermined wire patterns on the insulating tape in a lengthwise direction of the same, and (4) installing a plurality of semiconductor elements on a surface of the insulating tape in the lengthwise direction at uniform spaces, in a manner such that the semiconductor elements are electrically connected with the corresponding wire patterns, respectively, and the method further includes the step of (a) forming third holes, each at a position between two neighboring second holes in each line, in a manner such that each third hole bridges the two neighboring second holes so that the second holes in each line become continued, the step (a) being performed either before the step (3), between the steps (3) and (4), or after the step (4).

The foregoing method of fabrication of a semiconductor apparatus of the present invention preferably further includes the step of (b) separating, from the insulating tape, an inside part of the reinforcing tape between the lines of the second holes continued, after the step (a) of forming the third holes. With this, a step of removing the reinforcing tape from each semiconductor device is unnecessary after each semiconductor element and each wire pattern connected therewith are cut out as a semiconductor device. Therefore, the process of fabrication is simplified.

The method of fabrication of a semiconductor apparatus of the present invention preferably further includes the step of (c) sealing each semiconductor element with resin, and thereafter separating, from the insulating tape, an inside part of the reinforcing tape between the lines of the second holes continued. With this, a step of removing the reinforcing tape from each semiconductor device is unnecessary after each semiconductor element and each wire pattern connected therewith are cut out as a semiconductor device. Therefore, the process of fabrication is simplified. Besides, since the reinforcing tape is removed after the semiconductor elements are sealed with resin, the semiconductor elements are surely installed.

As described above, a reinforcing tape of the present invention is designed in a belt form, and made to adhere to a belt-form insulating tape so as to be laminated thereon, to reinforce the insulating tape in a manufacturing process, and the reinforcing tape has second holes used for removing a part of the reinforcing tape from the insulating tape after the adhesion.

The reinforcing tape of the present invention preferably further includes holes for transport use, which are provided at uniform spaces on both sides of the reinforcing tape. This ensures that transport and position adjustment can be executed with use of the transport-use holes provided at uniform spaces in the reinforcing tape. Therefore, in the case where the thin film insulating tape is transported in fabrication of semiconductor devices that can be used in a bent state, the work of transport is executed in a good state.

Further, the reinforcing tape of the present invention preferably includes openings at positions corresponding to semiconductor-element-installed positions on the insulating tape. This ensures that an undesirable matter as follows can be avoided: the heating of the vicinity of the semiconductor element-installed regions in the step of installation of semiconductor elements causes tight adhesion of the reinforcing tape to the insulating tape in the vicinity of the semiconductor element-installed regions, thereby making separation in the separating step difficult.

What is claimed is:

1. A reinforcing tape in a belt form made to adhere to a belt-form insulating tape so as to be laminated thereon, to reinforce the insulating tape in a manufacturing process, said reinforcing tape comprising:

regions which are to be provided with first holes for transport use, provided on portions of both sides in a width direction at transport of said reinforcing tape, said insulating tape not covering said regions;

second holes used for removing an inside part of said reinforcing tape from the insulating tape after the adhesion, the second holes being provided in portions of both sides in the width direction of said reinforcing tape, said second holes being closer to a central portion of said reinforcing tape than said regions to be provided with the first holes and being a boundary between said inside part to be removed and said regions which are to be provided with the first holes;

said second holes being covered by said insulating tape; and wherein said inside part to be removed is between said second holes at one side and said second holes at another side with a boundary of a row of said second holes on each side.

2. The reinforcing tape as set forth in claim 1, wherein the first holes for transport use are to be provided at uniform spaces on both sides of said reinforcing tape.

3. The reinforcing tape as set forth in claim 1, further including openings at positions corresponding to semiconductor-element-installed positions on the insulating tape.

4. The reinforcing tape as set forth in claim 2, further including openings at positions corresponding to semiconductor-element-installed positions on the insulating tape.

5. A tape structure for use in an electronic device for supporting a plurality of chips, the tape structure comprising:

an insulating tape for supporting a plurality of chips thereon;

an insulative reinforcing tape laminated to a side of said insulating tape opposite to a side of said insulating tape where the chips are to be supported;

wherein said reinforcing tape includes:

regions which are to be provided with first holes for transport use, provided on portions of both sides in width direction at transport of said reinforcing tape, said regions being not covered with said insulating tape; and second holes used for removing an inside part of said reinforcing tape from the insulating tape after the adhesion, provided on portions of both sides in width direction at transport of said reinforcing tape;

said second holes being closer to a central portion of said reinforcing tape than said regions which are to be provided with said first holes and being a boundary between said inside part and said regions which are to be provided with said first holes, and being covered with said insulating tape, and said inside part being between said second holes at one side and said second holes of another side with a boundary of a row of said second holes on each side.

6. The tape structure of claim 5, wherein said insulating tape comprises a plurality of third holes, provided on portions of both sides in width direction at transport of said reinforcing tape so as to bridge both said neighboring second holes at each side, wherein said inside part becomes detached from said opposing regions which are to be provided with said first holes.

7. A reinforcing tape in a belt form made to adhere to a belt-form insulating tape so as to be laminated thereon, to reinforce the insulating tape in a manufacturing process, said reinforcing tape comprising:

first holes for transport use provided on portions of both sides in a width direction at transport of said reinforcing tape, said insulating tape not covering said first holes;

second holes used for removing an inside part of said reinforcing tape from the insulating tape after the adhesion, the second holes being provided in portions of both sides in the width direction of said reinforcing tape, said second holes being closer to a central portion of said reinforcing tape than said first holes are, and being a boundary between said inside part to be removed and edge parts including the first holes;

said second holes being covered by said insulating tape; and wherein said inside part to be removed is between said second holes at one side and said second holes at another side.

8. A tape structure for use in an electronic device for supporting a plurality of chips, the tape structure comprising:

an insulating tape for supporting a plurality of chips thereon;

an insulative reinforcing tape laminated to a side of said insulating tape opposite to a side of said insulating tape where the chips are to be supported;

wherein said reinforcing tape includes:

first holes for transport use provided on portions of both sides in a width direction at transport of said reinforcing tape, said insulating tape not covering said first holes;

second holes used for removing an inside part of said reinforcing tape from the insulating tape after the adhesion, the second holes being provided in portions of both sides in the width direction of said reinforcing tape, said second holes being closer to a central portion of said reinforcing tape than said first holes are, and being a boundary between said inside part to be removed and edge parts including the first holes;

said second holes being covered by said insulating tape; and wherein said inside part to be removed is between said second holes at one side and said second holes at another side.

9. The tape structure of claim 8, wherein said insulating tape comprises a plurality of third holes, provided on portions of both sides in width direction at transport of said reinforcing tape so as to bridge both said neighboring second holes at each side, wherein said inside part becomes detached from said opposing edge parts.

* * * * *